(12) United States Patent
Hong et al.

(10) Patent No.: US 11,699,398 B2
(45) Date of Patent: Jul. 11, 2023

(54) ELECTROLUMINESCENT DISPLAY DEVICE

(71) Applicant: LG Display Co., Ltd., Seoul (KR)

(72) Inventors: Seok Hyun Hong, Gimpo-si (KR); Seong En Lee, Seoul (KR); Jung Hyeon Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/505,523

(22) Filed: Oct. 19, 2021

(65) Prior Publication Data

US 2022/0122545 A1 Apr. 21, 2022

(30) Foreign Application Priority Data

Oct. 19, 2020 (KR) .......................... 10-2020-0135087

(51) Int. Cl.
| | | |
|---|---|---|
| G09G 3/3266 | (2016.01) | |
| H10K 50/11 | (2023.01) | |
| H10K 59/12 | (2023.01) | |

(52) U.S. Cl.
CPC .......... *G09G 3/3266* (2013.01); *H10K 50/11* (2023.02); *H10K 59/12* (2023.02); *G09G 2320/0233* (2013.01)

(58) Field of Classification Search
CPC .......... G09G 2330/12; G09G 2330/08; G09G 2330/10; G09G 3/3677; G09G 3/006; G09G 3/3688; G09G 3/3648
See application file for complete search history.

(56) References Cited

U.S. PATENT DOCUMENTS

| | | | | |
|---|---|---|---|---|
| 2003/0011545 | A1* | 1/2003 | Sagano | G09G 3/22 |
| | | | | 345/694 |
| 2012/0249514 | A1* | 10/2012 | Ahn | G09G 3/3233 |
| | | | | 345/82 |
| 2015/0154908 | A1* | 6/2015 | Nam | G09G 3/3233 |
| | | | | 345/76 |
| 2016/0071445 | A1 | 3/2016 | Kim et al. | |
| 2018/0137825 | A1 | 5/2018 | An et al. | |
| 2018/0144689 | A1 | 5/2018 | Hong et al. | |
| 2019/0340966 | A1* | 11/2019 | Lee | G09G 3/006 |
| 2020/0193918 | A1 | 6/2020 | Hwang et al. | |

(Continued)

FOREIGN PATENT DOCUMENTS

| | | |
|---|---|---|
| CN | 105427794 A | 3/2016 |
| JP | 2014123125 A | 7/2014 |

(Continued)

*Primary Examiner* — Dong Hui Liang
(74) *Attorney, Agent, or Firm* — Seed IP Law Group LLP

(57) ABSTRACT

An electroluminescent display device includes a pixel configured to display an image based on a difference between a display data voltage and a first reference voltage, a driving voltage generation circuit configured to supply the display data voltage to the pixel through a data line, and a sensing circuit configured to supply the first reference voltage to the pixel through a sensing line. The sensing circuit includes a sensing channel terminal coupled to the sensing line, a switch coupled between the sensing channel terminal and an input terminal for the first reference voltage, and a sampling circuit configured to sense a voltage of the sensing line which has changed from the first reference voltage independent of driving characteristics of the pixel in a vertical blank period in which the switch is turned off.

20 Claims, 17 Drawing Sheets

(56) References Cited

U.S. PATENT DOCUMENTS

| | | |
|---|---|---|
| 2020/0202787 A1 | 6/2020 | Do et al. |
| 2021/0104185 A1* | 4/2021 | Park .................... G09G 3/3266 |
| 2021/0280144 A1* | 9/2021 | Miyawaki ............ G09G 3/3607 |
| 2021/0287583 A1* | 9/2021 | Shin .................... G09G 3/3275 |

FOREIGN PATENT DOCUMENTS

| | | |
|---|---|---|
| KR | 20150069804 A | 6/2015 |
| KR | 20170080337 A | 7/2017 |
| KR | 20170133779 A | 12/2017 |
| KR | 20190140760 A | 12/2019 |
| KR | 20200030853 A | 3/2020 |
| KR | 20200135087 A | 12/2020 |
| TW | I660337 B | 5/2019 |

* cited by examiner

FIG. 11

| Vactive | Vblank (BK1) | Vactive |
|---|---|---|
| Display Driving | RT Sensing | Display Driving |
| | PXL Sensing | |

FIG. 12

| Vactive | Vblank (BK2) | | Vactive |
|---|---|---|---|
| Display Driving | RT Sensing | | Display Driving |
| | SIO Sensing | PXL Sensing | |

ELECTROLUMINESCENT DISPLAY DEVICE

CROSS-REFERENCE TO RELATED APPLICATION

This application claims the benefit of Korean Patent Application No. 10-2020-0135087, filed on Oct. 19, 2020, which is hereby incorporated by reference as if fully set forth herein.

BACKGROUND

Technical Field

The present disclosure relates to an electroluminescent display device.

Description of the Related Art

In an active matrix type electroluminescent display device, pixels each including a light emitting element and a driving element are arranged in a matrix form and luminance of an image represented by pixels is controlled in response to a grayscale of video data. A driving element controls a pixel current flowing through a light emitting device according to a voltage applied across a gate electrode and a source electrode (hereinafter referred to as a "gate-source electrode") thereof. The emission intensity of the light emitting element and luminance of a screen are determined according to the pixel current.

A threshold voltage and electron mobility of a driving element and an operating point voltage (or a turn on voltage) of a light emitting element determine driving characteristics of a pixel and thus they need to be uniform in all pixels. However, driving characteristics of pixels may vary due to various factors such as process and deterioration characteristics. Such driving characteristic variation causes luminance deviation, which increases difficulty in displaying a pleasurable image.

A compensation technology for sensing and compensating for driving characteristic differences between pixels through sensing lines in order to compensate for luminance deviation between pixels is known.

BRIEF SUMMARY

The inventors have realized that sensing line defects can distort sensed values and compensation values derived therefrom. As such, driving of pixels sharing the sensing line may be overcompensated or undercompensated, causing a bright line or a dark line to be displayed, respectively.

Accordingly, the present disclosure is directed to an electroluminescent display device that substantially obviates one or more problems due to limitations and disadvantages of the related art.

A technical benefit of the present disclosure is to provide an electroluminescent display device for compensating for charging voltage sustainability differences between sensing lines to improve image quality.

To achieve these technical benefits and other advantages and in accordance with the purpose of the disclosure, as embodied and broadly described herein, an electroluminescent display device includes a pixel configured to display an image based on a difference between a display data voltage and a first reference voltage, a driving voltage generation circuit configured to supply the display data voltage to the pixel through a data line, a sensing circuit configured to supply the first reference voltage to the pixel through a sensing line. The sensing circuit includes a sensing channel terminal coupled to the sensing line, a switch coupled between the sensing channel terminal and an input terminal for the first reference voltage, and a sampling circuit configured to sense a voltage of the sensing line which has changed from the first reference voltage independent of driving characteristics of the pixel in a vertical blank period in which the switch is turned off.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 10 to FIG. 12 are diagrams illustrating an example of setting real time (RT) sensing in response to the duration of a vertical blank period;

DETAILED DESCRIPTION

Figure 1:
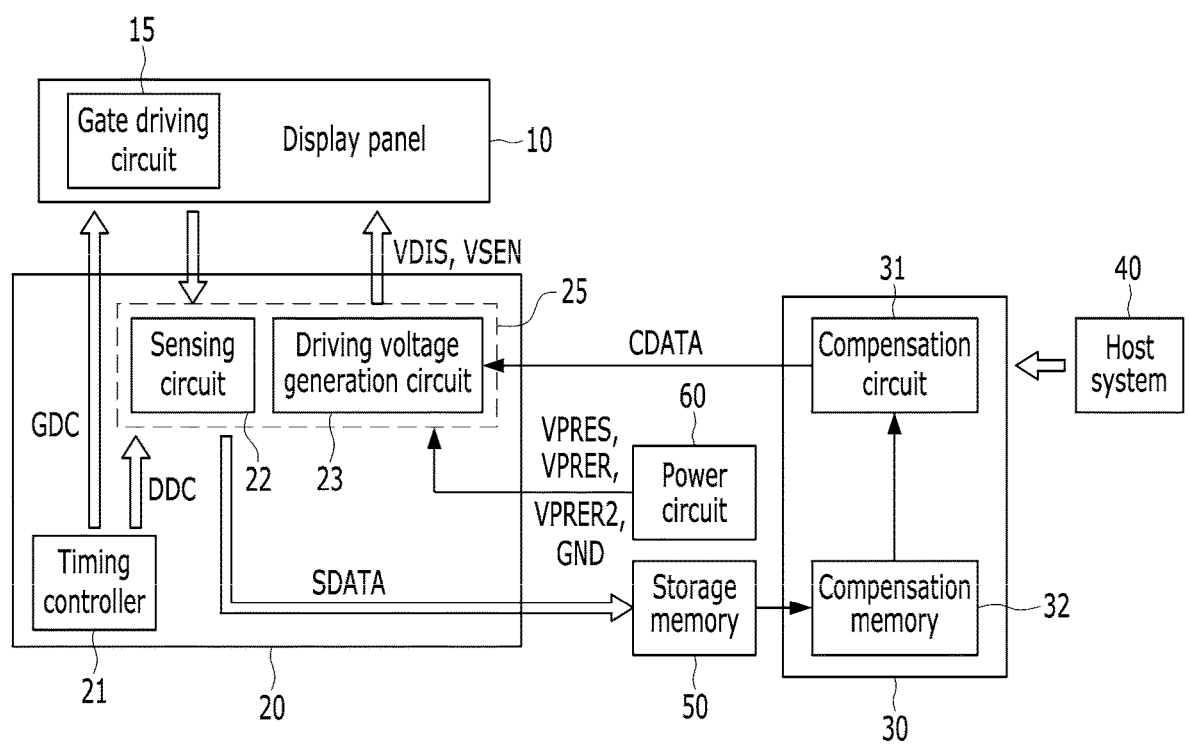
FIG. 1 is a diagram illustrating an electroluminescent display device according to an embodiment of the present disclosure.

The advantages and features of the present disclosure and the way of attaining the same will become apparent with reference to embodiments described below in detail in conjunction with the accompanying drawings. The present disclosure, however, is not limited to the embodiments disclosed hereinafter and may be embodied in many different forms. Rather, these exemplary embodiments are provided so that this disclosure will be through and complete and will fully convey the scope to those skilled in the art.

The shapes, sizes, ratios, angles, numbers, and the like, which are illustrated in the drawings in order to describe various embodiments of the present disclosure, are merely given by way of example, and therefore, the present disclosure is not limited to the illustrations in the drawings. The same or extremely similar elements are designated by the same reference numerals throughout the specification. In addition, in the description of the present disclosure, a detailed description of related known technologies will be omitted when it may make the subject matter of the present disclosure rather unclear. In the present specification, when the terms "comprise," "include," and the like are used, other elements may be added unless the term "only" is used. An element described in the singular form is intended to include a plurality of elements unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on," "above," "below," "beside," or the like, one or more other parts may be located between the two parts unless the term "directly" or "closely" is used.

Although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

In the present disclosure, a pixel circuit formed on a substrate of a display panel may be implemented as a thin film transistor (TFT) in an n-type metal oxide semiconductor field effect transistor (MOSFET) structure or a TFT in a p-type MOSFET structure. A TFT is a 3-electrode element including a gate, a source, and a drain. The source is an electrode that supplies carriers to the transistor. Carriers flow from the source in the TFT. The drain is an electrode through which carriers are discharged to the outside. That is, carriers flow from the source to the drain in a MOSFET. In the case of an n-type TFT (NMOS), carriers are electrons and thus a source voltage is lower than a drain voltage such that electrons can flow from the source to the drain. Since electrons flow from the source to the drain in the n-type TFT, current flows from the drain to the source. On the contrary, in the case of a p-type TFT (PMOS), carriers are holes and thus a source voltage is higher than a drain voltage such that holes can flow from the source to the drain. Since holes flow from the source to the drain in the p-type TFT, current flows from the source to the drain. It should be noted that the source and the drain of a MOSFET are not fixed. For example, the source and the drain of a MOSFET may be changed according to an applied voltage.

In the present disclosure, a semiconductor layer of a TFT may be formed of at least one of oxide, amorphous silicon, and polysilicon.

Hereinafter, embodiments of the present disclosure will be described in detail with reference to the attached drawings. In the following description, a detailed description of known functions and configurations incorporated herein will be omitted when it may obscure the subject matter of the present disclosure.

Figure 2:
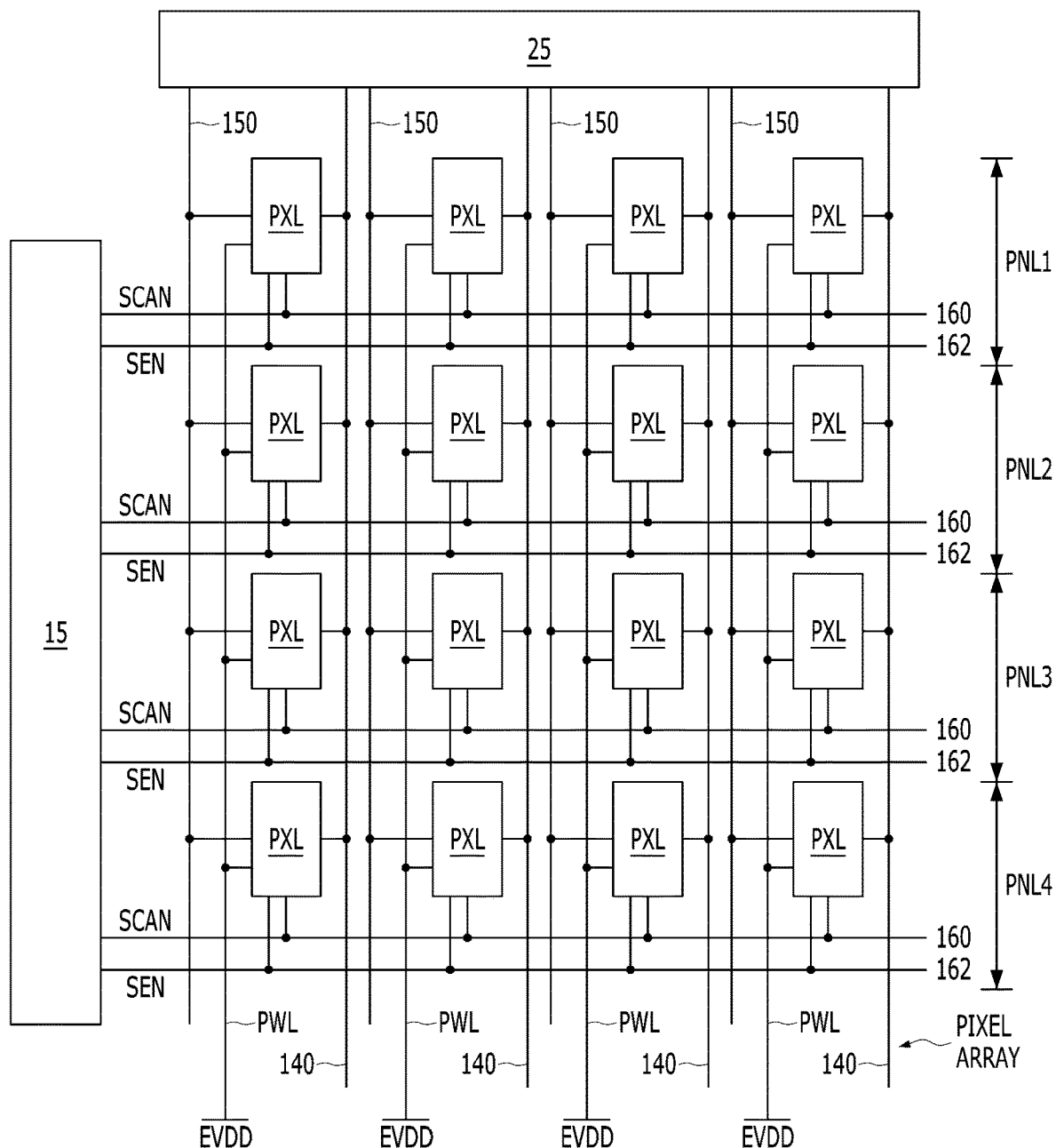
FIG. 2 is a diagram illustrating an example of a pixel array included in a display panel of FIG. 1.

FIG. 1 is a diagram illustrating an electroluminescent display device according to an embodiment of the present disclosure and FIG. 2 is a diagram illustrating an example of a pixel array included in a display panel of FIG. 1.

Referring to FIG. 1 and FIG. 2, an electroluminescent display device according to an embodiment of the present disclosure includes a display panel 10, a driver integrated circuit 20, a compensation integrated circuit 30, a host system 40, a storage memory 50, and a power circuit 60. A panel driving circuit for driving the display panel 10 includes a gate driving circuit 15 included in the display panel 10 and a data driving circuit 25 included in the driver integrated circuit 20.

The display panel 10 includes a plurality of pixel lines PNL1 to PNL4, and each pixel line includes a plurality of pixels PXL and a plurality of signal lines. A "pixel line" described in the present disclosure is not a signal line and means a set of pixels PXL and signal lines neighboring in a direction in which gate lines extend. Signal lines may include data lines 140 for supplying a display data voltage VDIS and a sensing data voltage VSEN to pixels PXL, reference voltage lines 150 for supplying a reference voltage VPRER or VPRES to the pixels PXL, gate line pairs 160 and 162 for supplying gate signals SCAN and SEN to the pixels PXL, and a high-level power line PWL for supplying a high-level pixel voltage to the pixels PXL.

The pixels PXL of the display panel 10 are arranged in a matrix form to constitute a pixel array. Each pixel PXL included in the pixel array of FIG. 2 may be connected to one of the data lines 140, one of the reference voltage lines 150, one of the high-level power lines PWL, and one of the gate line pairs 160 and 162. Each pixel PXL included in the pixel array of FIG. 2 may also be provided with a low-level pixel voltage from the power circuit 60. The power circuit 60 may supply the low-level pixel voltage to the pixels PXL through a low-level power line or a pad.

The display panel 10 may include the gate driving circuit 15 embedded therein. The gate driving circuit 15 may be positioned in a non-display area outside a display area in which the pixel array is formed.

The gate driving circuit 15 may include a plurality of gate stages connected to the gate line pairs 160 and 162 of the pixel array. The gate stages may generate a first gate signal SCAN for controlling switch elements of the pixels PXL, supply the first gate signal SCAN to the first gate lines 160, generate a second gate signal SEN for controlling the switch elements of the pixels PXL and supply the second gate signal SEN to the second gate lines 162.

The driver integrated circuit 20 may include a timing controller 21 and the data driving circuit 25, but the present disclosure is not limited thereto. The timing controller 21 may be mounted on a control board along with the driver integrated circuit 20 instead of being included in the driver integrated circuit 20. The data driving circuit 25 may include a sensing circuit 22 and a driving voltage generation circuit 23, but the present disclosure is not limited thereto.

The timing controller 21 may generate a gate timing control signal GDC for controlling operation timing of the gate driving circuit 15 and a data timing control signal DDC for controlling operation timing of the data driving circuit 25 on the basis of timing signals input from the host system 40, for example, a vertical synchronization signal Vsync, a horizontal synchronization signal Hsync, a dot clock signal DCLK, and a data enable signal DE.

The data timing control signal DDC may include a source start pulse signal, a source sampling clock signal, and a source output enable signal, but the present disclosure is not limited thereto. The source start pulse signal controls data sampling start timing of the driving voltage generation circuit 23. The source sampling clock signal controls data sampling timing based on a rising or falling edge. The source output enable signal controls output timing of the driving voltage generation circuit 23.

The gate timing control signal GDC may include a gate start pulse signal and a gate shift clock signal, but the present disclosure is not limited thereto. The gate start pulse signal is applied to a gate stage that generates a first gate output to enable operation of the gate stage. The gate shift clock signal is commonly input to the gate stages and shifts the gate start pulse signal.

The timing controller 21 may sense driving characteristics of the pixels PXL in a vertical blank period of each frame by controlling operation timing of the panel driving circuit. Further, the timing controller 21 may additionally sense voltage sustainability of sensing lines before detecting the driving characteristics of the pixels PXL in at least one of a plurality of vertical blank periods by controlling operation timing of the panel driving circuit. The timing controller 21 may further sense the driving characteristics of the pixels PXL in a power on period or a power off period by controlling operation timing of the panel driving circuit.

Here, the power on period is a period from when system power is applied to when a screen is turned on and the power off period is a period from when the screen is turned off to when system power is off. A vertical blank period is positioned between neighboring vertical active periods and is a period in which writing of video data stops. A vertical active period is a period in which video data is written in the display panel 10 in order to display an image. The driving characteristics of the pixels PXL may include at least one of a threshold voltage and electron mobility of driving elements included in the pixels PXL, and an operating point voltage of light emitting elements. Sensing lines may be the reference voltage lines 150.

The timing controller 21 may realize a display operation and a sensing operation by controlling sensing operation timing and display operation timing of the pixel lines PNL1 to PNL4 of the display panel 10 according to a predetermined sequence or selected sequence.

The timing controller 21 may generate timing control signals GDC and DDC for display operation and timing control signals GDC and DDC for sensing operation such that they are different from each other. The sensing operation includes pixel sensing operation and SIO sensing operation. The pixel sensing operation is an operation of writing a sensing data voltage VSEN in sensing target pixels PXL to sense driving characteristics of the pixels PXL and updating a first compensation value for compensating for change in the driving characteristics of the pixels PXL on the basis of sensing result data SDATA. The SIO sensing operation is an operation of sensing voltage sustainability of sensing lines and updating a second compensation value for compensating for voltage deviation in the sensing lines. The display operation is an operation of correcting digital video data to be input to the corresponding pixels PXL on the basis of the updated first and second compensation values and applying a display data voltage VDIS corresponding to the corrected video data CDATA to the pixels PXL to display an input image.

The driving voltage generation circuit 23 may be implemented as a digital-to-analog converter (DAC) that converts a digital signal into an analog signal. The driving voltage generation circuit 23 may be connected to the pixels PXL through the data lines 140. The driving voltage generation circuit 23 generates the sensing data voltage VSEN used in the pixel sensing operation and the display data voltage VDIS used in the display operation and supplies the sensing data voltage VSEN and the display data voltage VDIS to the data lines 140. The display data voltage VDIS is a digital-to-analog conversion result for the digital video data CDATA corrected in the compensation integrated circuit 30 and may vary according to a grayscale value and a compensation value in pixel units. The sensing data voltage VSEN may be set differently in red, green, blue, and white pixels in consideration of different driving characteristics of driving elements for colors.

The sensing circuit 22 may be connected to the pixels PXL through the sensing lines used as the reference voltage lines 150. The sensing circuit 22 supplies a first reference voltage VPRER used in the display operation to the sensing lines 150 and supplies a second reference voltage VPRES used in the pixel sensing operation to the sensing lines 150. The sensing circuit 22 may sense specific node voltages of pixels PXL which represent driving characteristics of the pixels PXL through the sensing lines 150 during pixel sensing operation. The sensing circuit 22 may sense discharge characteristics of the sensing lines 150 in which voltages thereof decrease from the first reference voltage VPRER during SIO sensing operation.

The sensing circuit 22 may simultaneously process a plurality of analog sensing values using a plurality of analog-to-digital converters (ADCs) in parallel or sequentially process the plurality of analog sensing values using a single ADC. The ADC converts the analog sensing values into digital sensing result data SDATA in a predetermined sensing range or selected sensing range and then supplies the digital sensing result data SDATA to the storage memory 50.

The storage memory 50 stores the digital sensing result data SDATA received from the sensing circuit 22 during sensing operation. The storage memory 50 may be implemented as a flash memory, but the present disclosure is not limited thereto.

The compensation integrated circuit 30 may include a compensation circuit 31 and a compensation memory 32. The compensation memory 32 transmits the digital sensing result data SDATA read from the storage memory 50 to the compensation circuit 31. The compensation memory 32 may be a random access memory (RAM), for example, double data rate synchronous dynamic RAM (DDR SDRAM), but the present disclosure is not limited thereto. The compensation circuit 31 calculates a compensation offset and a compensation gain for each pixel on the basis of the digital sensing result data SDATA read from the storage memory 50, corrects video data received from the host system 40 according to the calculated compensation offset and compensation gain, and provides the corrected video data CDATA to the driver integrated circuit 20.

The power circuit 60 may generate the high-level pixel voltage and the low-level pixel voltage to be supplied to the pixels PXL. In addition, the power circuit 60 may generate the first reference voltage VPRER, the second reference voltage VPRES, a third reference voltage VPRER2, and a ground voltage GND to be supplied to the sensing circuit 22.

The first reference voltage VPRER may be higher than the second reference voltage VPRES such that the driving characteristics of the pixels PXL and the sensing range of the sensing circuit 22 can be satisfied. The third reference voltage VPRER2 may be higher than the first reference voltage VPRER such that sensing discrimination in the sensing circuit 22 can be improved. The second reference voltage VPRES may have the same level as the ground voltage GND.

Figure 3:
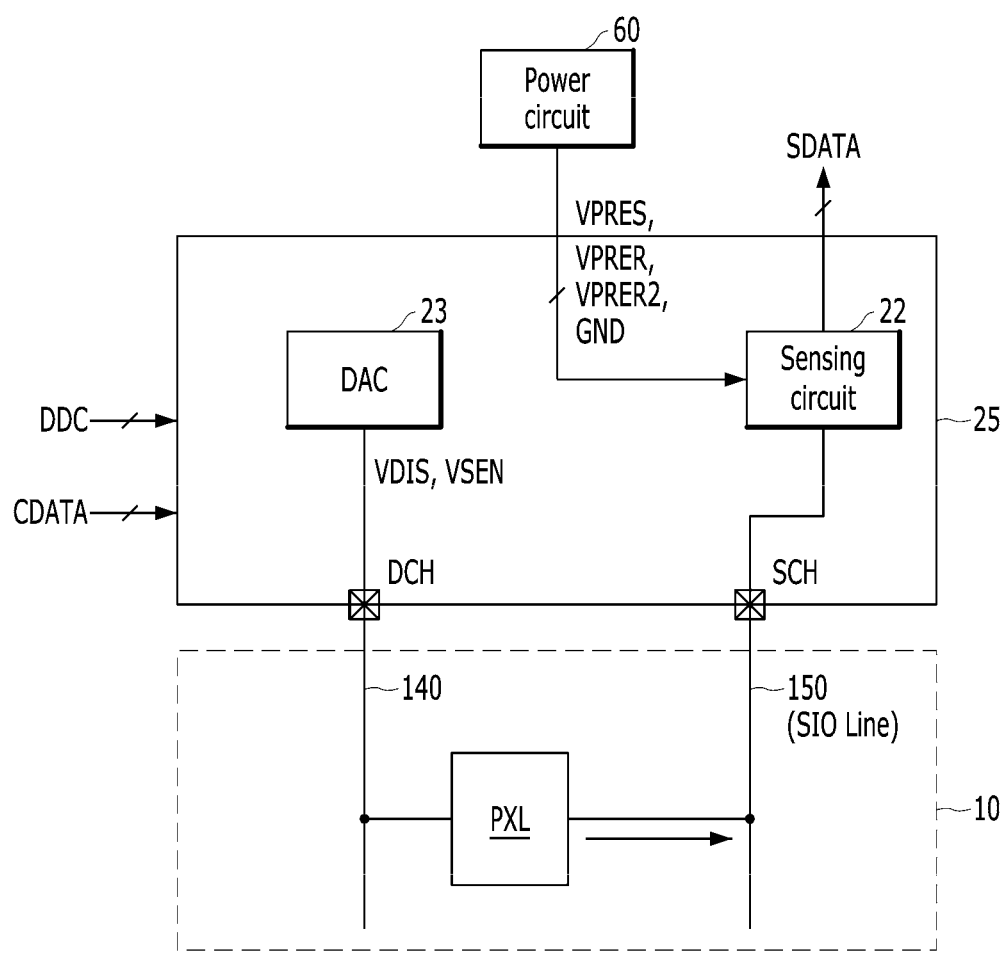
FIG. 3 is a diagram illustrating a configuration of a data driving circuit connected to the pixel array of FIG. 2.

FIG. 3 is a diagram illustrating a configuration of the data driving circuit 25 connected to the pixel array of FIG. 2.

Referring to FIG. 3, the data driving circuit 25 may be connected to a first node (a gate electrode of a driving element) of a pixel PXL through the data line 140 and connected to a second node (a source electrode of the driving element) of the pixel PXL through the sensing line 150. A voltage set to the second node may vary according to driving characteristics of the pixel PXL.

The data driving circuit 25 may include the driving voltage generation circuit (DAC) 23 and the sensing circuit 22. The DAC 23 is connected to the data line 140 of the display panel 10 through a data channel DCH and the sensing circuit 22 is connected to the sensing line 150 of the display panel 10 through a sensing channel SCH. The DAC 23 generates the sensing data voltage VSEN and the display data voltage VDIS.

During display operation, the sensing channel SCH provides a path through which the first reference voltage VPRER is charged in the sensing line 150. During SIO sensing operation, the sensing channel SCH provides a path through which the first reference voltage VPRER charged in the sensing line 150 is discharged and sensed through the sensing circuit 22. During pixel sensing operation, the sensing channel SCH provides a path through which the second reference voltage VPRES is charged in the sensing line 150 and then provides a path through which a second node voltage of the pixel PXL is sensed through the sensing circuit 22.

Figure 4:
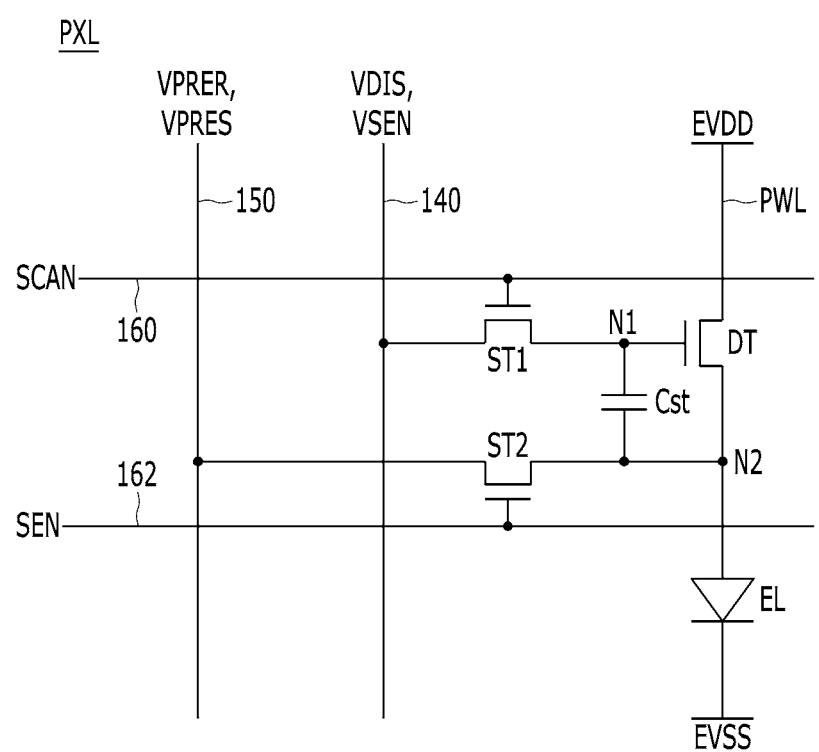
FIG. 4 is an equivalent circuit diagram of a pixel shown in FIG. 3.

FIG. 4 is an equivalent circuit diagram of the pixel shown in FIG. 3. FIG. 4 illustrates a pixel PXL using the reference voltage line 150 as a sensing line. It is noted that the technical spirit of the present disclosure is not limited to the pixel structure of FIG. 4.

Referring to FIG. 4, one pixel PXL includes a light emitting element EL, a driving TFT DT, switch TFTs ST1 and ST2, and a storage capacitor Cst. The driving TFT DT and the switch TFTs ST1 and ST2 may be implemented as NMOSs, but the present disclosure is not limited thereto.

The light emitting element EL emits light according to a pixel current supplied from the driving TFT DT. The light emitting element EL may be implemented as an organic light emitting diode including an organic emission layer or an inorganic light emitting diode including an inorganic emission layer. An anode of the light emitting element EL is connected to a second node N2 and a cathode thereof is connected to an input terminal for receiving a low-level pixel voltage EVSS.

The driving TFT DT is a driving element that generates a pixel current in response to a gate-source voltage. The gate electrode of the driving TFT DT is connected to a first node N1, a first electrode thereof is connected to an input terminal for receiving a high-level pixel voltage EVDD through the high-level power line PWL, and the second electrode thereof is connected to the second node N2.

The switch TFTs ST1 and ST2 are switch elements that set the gate-source voltage of the driving TFT DT and connect the first electrode of the driving TFT DT to the data line 140 or connect the second electrode of the driving TFT DT to the sensing line 150.

The first switch TFT ST1 is connected between the data line 140 and the first node N1 and turned on according to the first gate signal SCAN from the first gate line 160. The first switch TFT ST1 is turned on at the time of programming for display operation or pixel sensing operation. When the first switch TFT ST1 is turned on, the display data voltage VDIS or the sensing data voltage VSEN is applied to the first node N1. The gate electrode of the first switch TFT ST1 is connected to the first gate line 160, the first electrode thereof is connected to the data line 140, and the second electrode thereof is connected to the first node N1.

The second switch TFT ST2 is connected between the sensing line 150 and the second node N2 and turned on according to the second gate signal SEN from the second gate line 162. The second switch TFT ST2 is turned on at the time of programming for display operation or pixel sensing operation to apply the first reference voltage VPRER or the second reference voltage VPRES to the second node N2. The second switch TFT ST2 is turned on in a sensing period for pixel sensing operation to connect the second node N2 to the sensing line 150 such that the voltage of the second node N2 in which driving characteristics of the driving TFT DT or the light emitting element EL have been reflected is charged in the sensing line 150. The second switch TFT ST2 maintains an off state at the time of SIO sensing operation to block electrical connection between the second node N2 and the sensing line 150. The gate electrode of the second switch TFT ST2 is connected to the second gate line 162, the first electrode thereof is connected to the sensing line 150, and the second electrode thereof is connected to the second node N2.

The storage capacitor Cst is connected between the first node N1 and the second node N2 and maintains the gate-source voltage of the driving TFT DT for a predetermined period or selected period.

The pixel PXL having the aforementioned configuration displays an image according to a first current based on a difference between the display data voltage VDIS and the first reference voltage VPRER during display operation and charges the second node N2 and the sensing line 150 according to a pixel current based on a difference between the sensing data voltage VSEN and the second reference voltage VPRES at the time of pixel sensing operation. The pixel PXL is electrically disconnected from the sensing line 150 at the time of SIO sensing operation.

Figure 5:
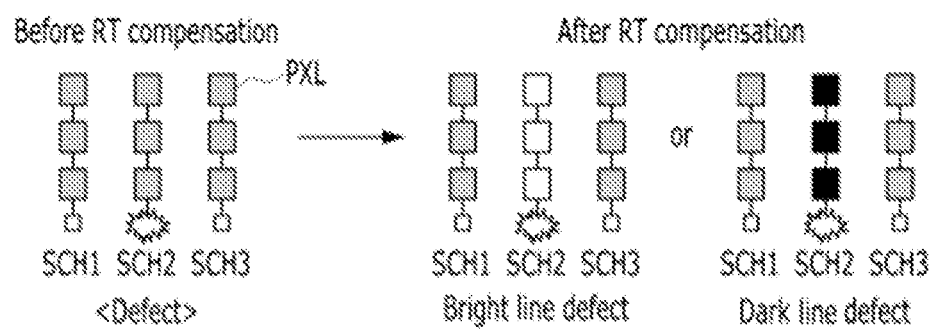
FIG. 5 and FIG. 6 are diagrams for describing the reason why SIO sensing operation is needed.
Figure 6:
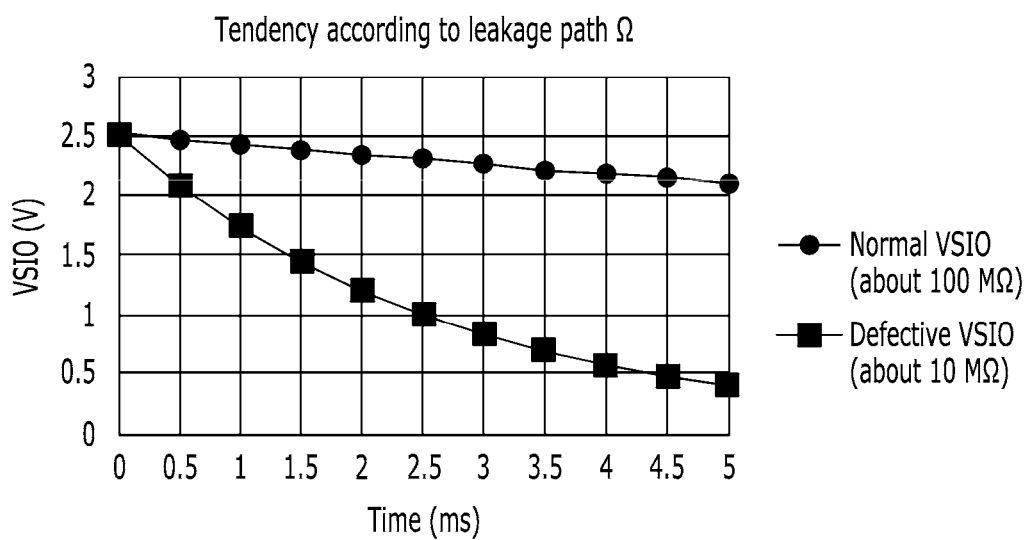

FIG. 5 and FIG. 6 are diagrams for describing the reason why SIO sensing operation is needed.

As described above, pixel sensing operation is an operation for compensating for luminance deviation due to change in driving characteristics of pixels by sensing the change in driving characteristics of the pixels and correcting digital image data based on the sensing result. Driving characteristics of pixels are sensed through sensing lines. If a sensing line connected to a specific sensing channel (e.g., SCH2) is defective, sensing values and compensation values of pixels sharing the sensing line SCH2 are distorted and thus a bright line or a dark line may be visually recognized in the display panel, as shown in FIG. 5. Defects in sensing lines may be caused by short-circuit between a sensing line and the ground voltage due to moisture permeation, short-circuit between a sensing line and a specific voltage source (higher than the ground voltage) due to foreign substance, and the like. The voltage of the second node charged in a sensing line during pixel sensing operation may be distorted due to a defect in the sensing line, causing erroneous sensing and erroneous compensation.

For example, when leakage resistance of a sensing line decreases to be lower than a normal value due to moisture permeation, as shown in FIG. 6, a sensing line voltage VSIO representing driving characteristics of pixels considerably decreases to be lower than a natural discharge value and a sensing value may be distorted in an under flow form. In a case where short-circuit occurs between a sensing line and a specific voltage source with a high voltage due to foreign substances, the sensing line voltage VSIO representing driving characteristics of pixels increases to the specific voltage and a sensing value may be distorted in the form of overflow.

The SIO sensing operation is an operation for sensing voltage sustainability of sensing lines to detect voltage deviation between sensing lines irrelevant to driving characteristics of pixels. The SIO sensing operation may be performed prior to pixel sensing operation in a vertical blank period. The second compensation value according to the SIO sensing operation may be updated separately from the first compensation value according to the pixel sensing operation. Since digital video data is corrected based on the first compensation value and the second compensation value, driving characteristic deviation between pixels and voltage deviation between sensing lines can be compensated.

The SIO sensing operation can be usefully applied in a variable refresh rate (VRR) environment in which a frame frequency varies depending on an input image. The VRR technique will be described with reference to FIG. 7 to FIG. 9.

Figure 7:
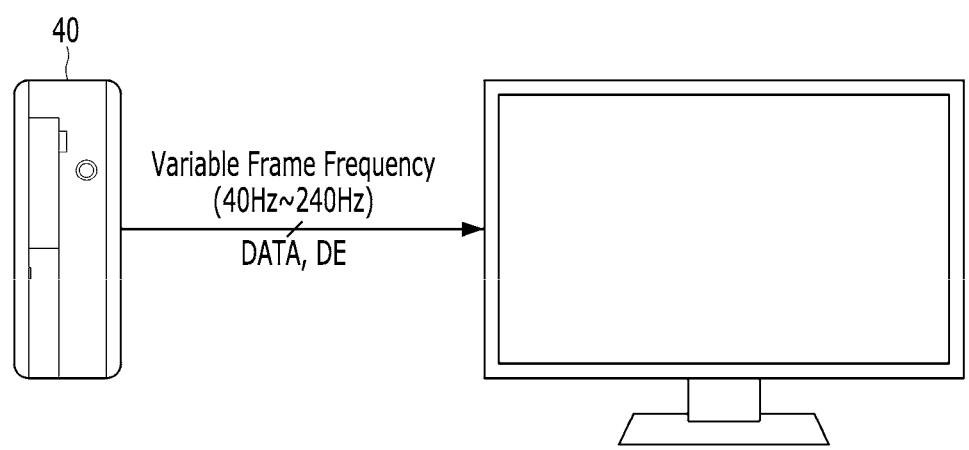
FIG. 7 is a diagram illustrating exchange of signals according to a variable frame frequency between a host system and a timing controller.
Figure 8:
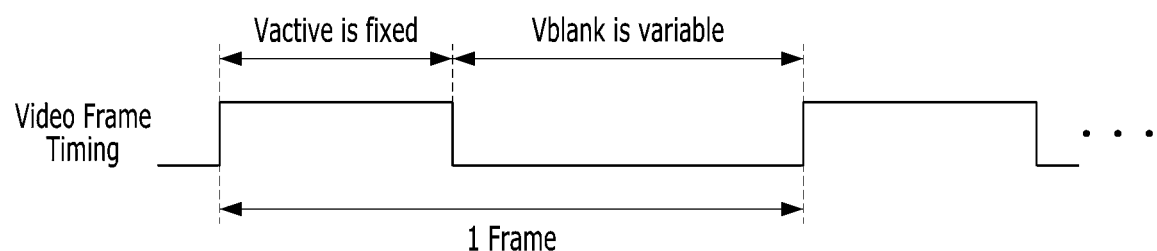
FIG. 8 and FIG. 9 are diagrams for describing a VRR technique for varying a frame frequency depending on an input image.
Figure 9:
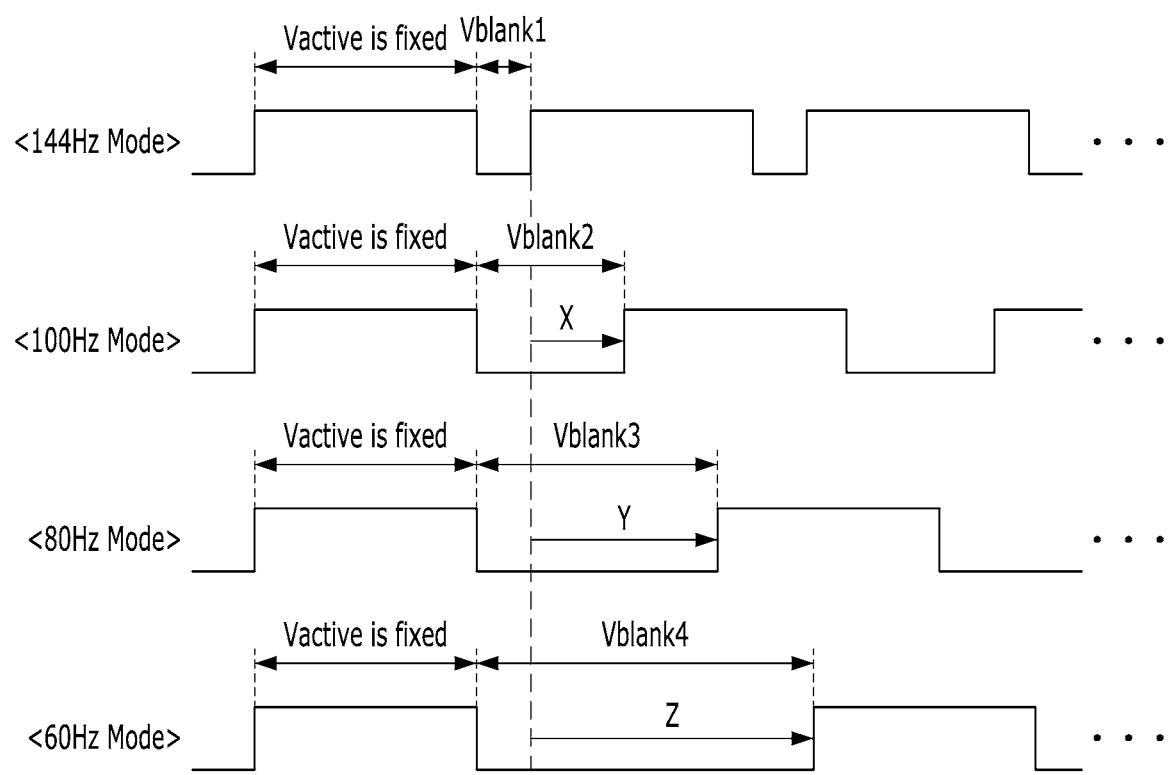
Figure 10:
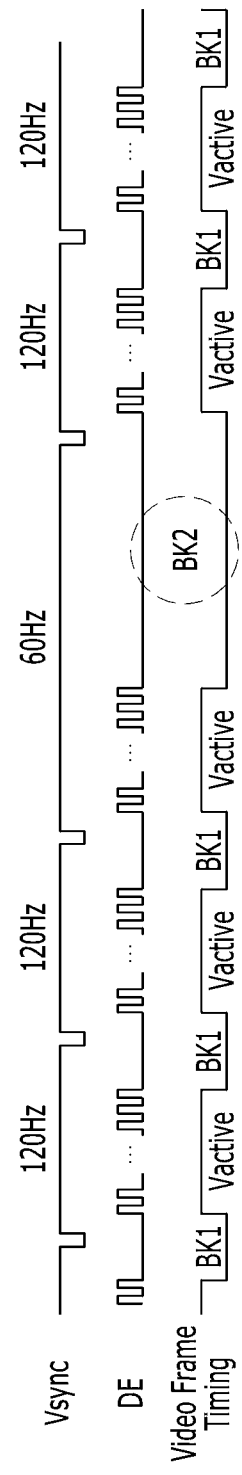

FIG. 7 to FIG. 9 are diagrams for describing the VRR technique for varying a frame frequency depending on an input image. FIG. 10 to FIG. 12 are diagrams illustrating an example of setting real time (RT) sensing in response to the duration of a vertical blank period.

Referring to FIG. 7, the host system 40 is connected to the compensation integrated circuit through various interface circuits and transmits input video data DATA, the data enable signal DE, and the like for driving the panel to the compensation integrated circuit. The host system 40 may include a graphics processor unit and a frame memory, render input video data according to a predetermined application or selected application and then transmit the rendering result to the compensation integrated circuit. The graphics processor unit performs rendering operation in a manner of processing video data per frame according to various video processing commands and storing processed frame data in the frame memory using a draw command.

The host system 40 may change a frame frequency in consideration of a data rendering time of an input image. When the frame frequency is changed, problems such as cut-off of a screen, an unstable screen, and input delay can be solved. The host system 40 may adjust the frame frequency within a frequency range of 40 Hz to 240 Hz according to a data rendering time of an input image. In the case of a still image, the host system 40 may adjust the frame frequency within a frequency range of 1 Hz to 10 Hz, but the present disclosure is not limited thereto. A range of the variable frame frequency may be set depending on a model and specifications.

The host system 40 may change the frame frequency by fixing a vertical active period Vactive and adjusting the duration of a vertical blank period Vblank according to a data rendering time of an input image, as shown in FIG. 8. For example, the host system 40 may have a first vertical blank period Vblank1 in order to realize a 144 Hz mode, as shown in FIG. 9. The host system 40 may have a second vertical blank period Vblank2 increasing from the first vertical blank period Vblank1 by a period "X" in order to realize a 100 Hz mode. The host system 40 may have a third vertical blank period Vblank3 increasing from the first vertical blank period Vblank1 by a period "Y" in order to realize an 80 Hz mode. The host system 40 may have a fourth vertical blank period Vblank4 increasing from the first vertical blank period Vblank1 by a period "Z" in order to realize a 60 Hz mode.

According to this VRR technique, the duration of a vertical blank period is varied and the duration of a vertical active period is fixed depending on an input image to change the frame frequency. In a VRR environment, the duration of the vertical blank period decreases as the frame frequency increases and increases as the frame frequency decreases. When the frame frequency is high, only pixel sensing operation is performed except SIO sensing operation because the duration of the vertical blank period is short. When the frame frequency is low, both SIO sensing operation and pixel sensing operation may be performed because the duration of the vertical blank period is long.

When video frames are configured at frame frequencies of 60 Hz and 120 Hz, as shown in FIG. 10, for example, only pixel sensing operation may be performed in a vertical blank period BK1 according to the frame frequency of 120 Hz, and both the pixel sensing operation and SIO sensing operation may be performed in a vertical blank period BK2 according to the frame frequency of 60 Hz. In FIG. 10, Vsync is a vertical synchronization signal that may indicate the beginning and the end of each frame and DE is a data enable signal. The data enable signal DE is synchronized with writing timing of the display data voltage, and thus transition of the data enable signal DE occurs only in vertical active periods and does not occur in vertical blank periods. In FIG. 11 and FIG. 12, RT sensing means a sensing operation performed in a vertical blank period.

Hereinafter, various embodiments with respect to the sensing circuit 22 capable of realizing SIO sensing operation and pixel sensing operation will be described.

First Embodiments

Figure 13:
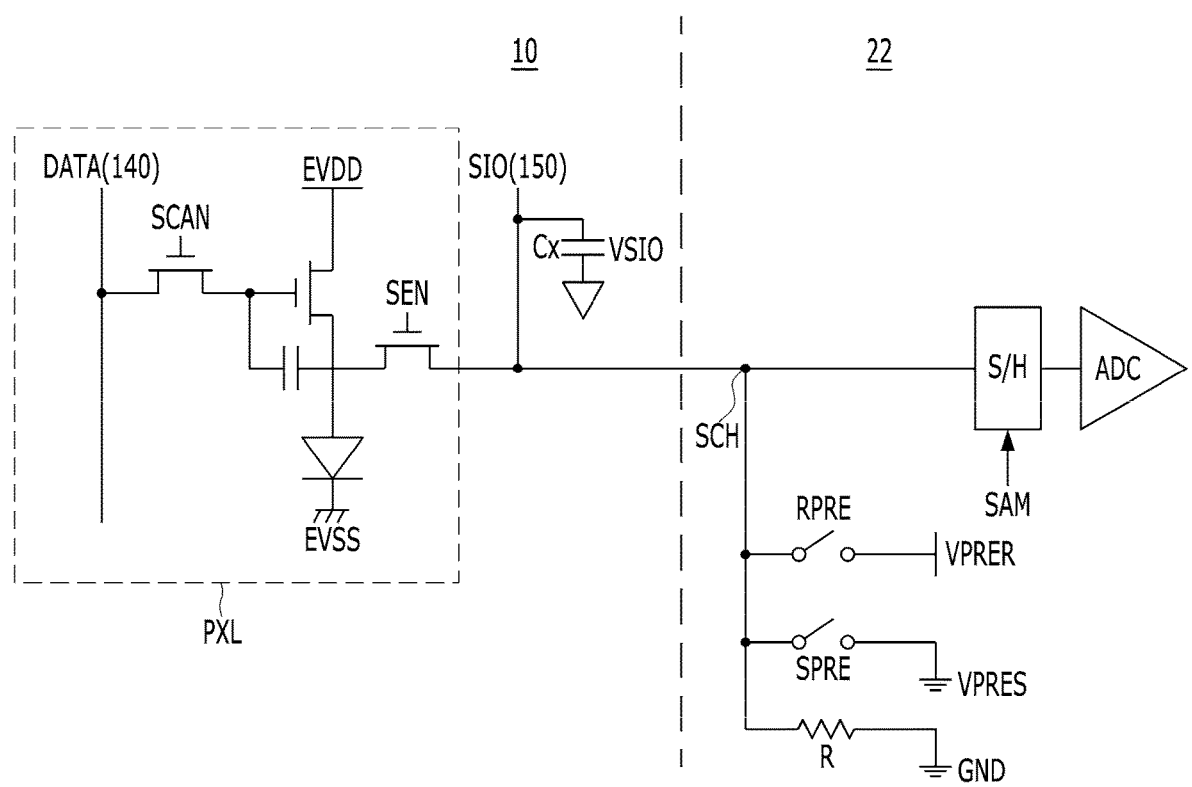
FIG. 13 is a diagram illustrating a circuit for sensing driving characteristic variation in pixels and voltage variation in sensing lines in a first embodiment of the present disclosure.
Figure 14:
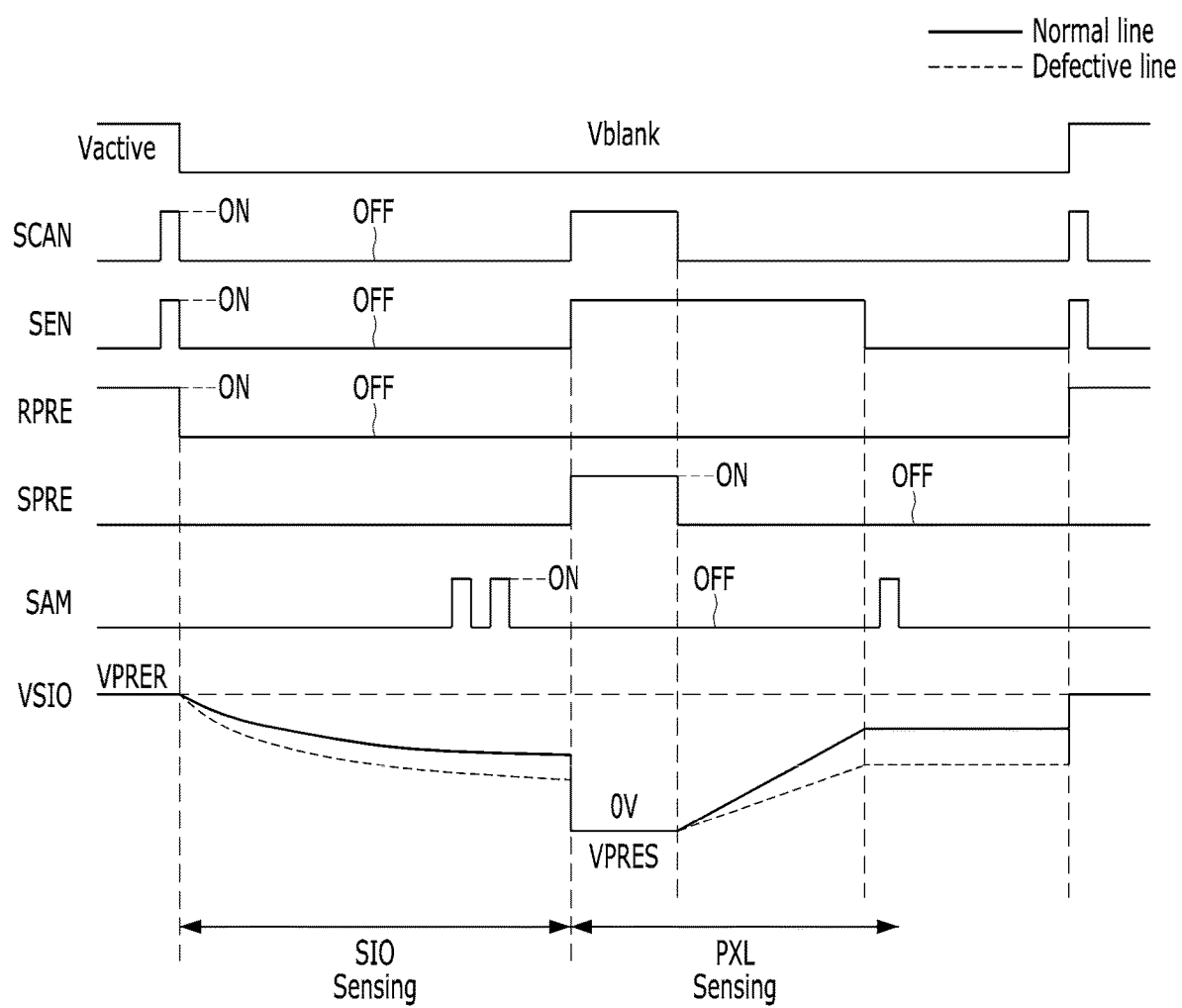
FIG. 14 is a driving waveform diagram with respect to the circuit of FIG. 13.

FIG. 13 is a diagram illustrating a circuit for sensing driving characteristic variation in pixels and voltage variation in sensing lines in a first embodiment of the present disclosure, and FIG. 14 is a driving waveform diagram with respect to the circuit of FIG. 13.

Referring to FIG. 13, the sensing circuit 22 may include a sensing channel terminal SCH connected to the sensing line 150, a switch RPRE connected between the sensing channel terminal SCH and an input terminal for the first reference voltage VPRER, a switch SPRE connected between the sensing channel terminal SCH and an input terminal for the second reference voltage VPRES, and a sampling unit S/H. In FIG. 13, R equivalently represents leakage resistance of the sensing line 150. Sensing lines 150 may have different values of the leakage resistance R, and the leakage resistance R may be any one of a normal value, a defect value, and an intermediate value between the normal value and the defect value, as shown in FIG. 6. In FIG. 13, Cx represents a parasitic capacitor present in the sensing line 150.

The sampling unit S/H may realize SIO sensing operation by sensing a voltage VSIO of the sensing line 150 which has changed from the first reference voltage VPRER independent of driving characteristics of the pixel PXL in a vertical blank period Vblank in which the switch RPRE is turned off.

Referring to FIG. 14, the sensing circuit 22 charges the first reference voltage VPRER in the parasitic capacitor Cx of the sensing line 150 for display operation in a vertical active period Vactive preceding a vertical blank period Vblank.

An SIO sensing period may be allocated within the vertical blank period Vblank.

In the SIO sensing period, the sensing line 150 is electrically disconnected from the pixel PXL, the input terminal for the first reference voltage VPRER, and the input terminal for the second reference voltage VPRES. In such a pseudo-floating state, a discharging path connected to the ground voltage GND through the leakage resistance R may be formed in the sensing line 150. In a normal case, illustrated by a solid line in FIG. 14, decrement in the voltage VSIO of the sensing line 150 is small (natural discharging) because the leakage resistance R of the sensing line 150 is large. On the other hand, in an abnormal case such as pseudo-short-circuiting, illustrated in phantom in FIG. 14, decrement in the voltage VSIO of the sensing line 150 increases (over-discharging) because the leakage resistance R of the sensing line decreases. The sampling unit S/H may detect voltage deviation between sensing lines 150 by sampling the voltage VSIO of the sensing lines 150 varied due to discharging multiple times. In one or more embodiments, the voltage VSIO is sampled at least two times in the SIO sensing period, indicated in FIG. 14 by two pulses labeled "ON" in sampling signal SAM.

A pixel sensing period (labeled "PXL Sensing" in FIG. 14) may be allocated following the SIO sensing period in the vertical blank period Vblank.

In the pixel sensing period, the sensing line 150 continues to be connected to the second node of the pixel PXL. The pixel sensing period may include a programming period and a sampling period. In the programming period, the switch SPRE is turned on such that the second reference voltage VPRES (0 V) is applied to the second node of the pixel PXL through the sensing line 150. Here, the sensing data voltage is applied to the first node of the pixel PXL through the data line 140. In the sampling period, the pixel PXL becomes a constant current source that generates a pixel current. This pixel current causes the voltage of the second node to increase, and the slope of the increasing voltage depends on driving characteristics of the pixel PXL. In the sampling period, change in the voltage of the second node is reflected in the voltage VSIO of the sensing line 150 because the pixel PXL and the sensing line 150 maintain a connected state. The sampling unit S/H can detect voltage deviation between pixels with respect to the voltage of the second node by sampling the voltage VSIO of the sensing line 150, indicated by a third pulse in sampling signal SAM shown in FIG. 14.

Second Embodiments

Figure 15:
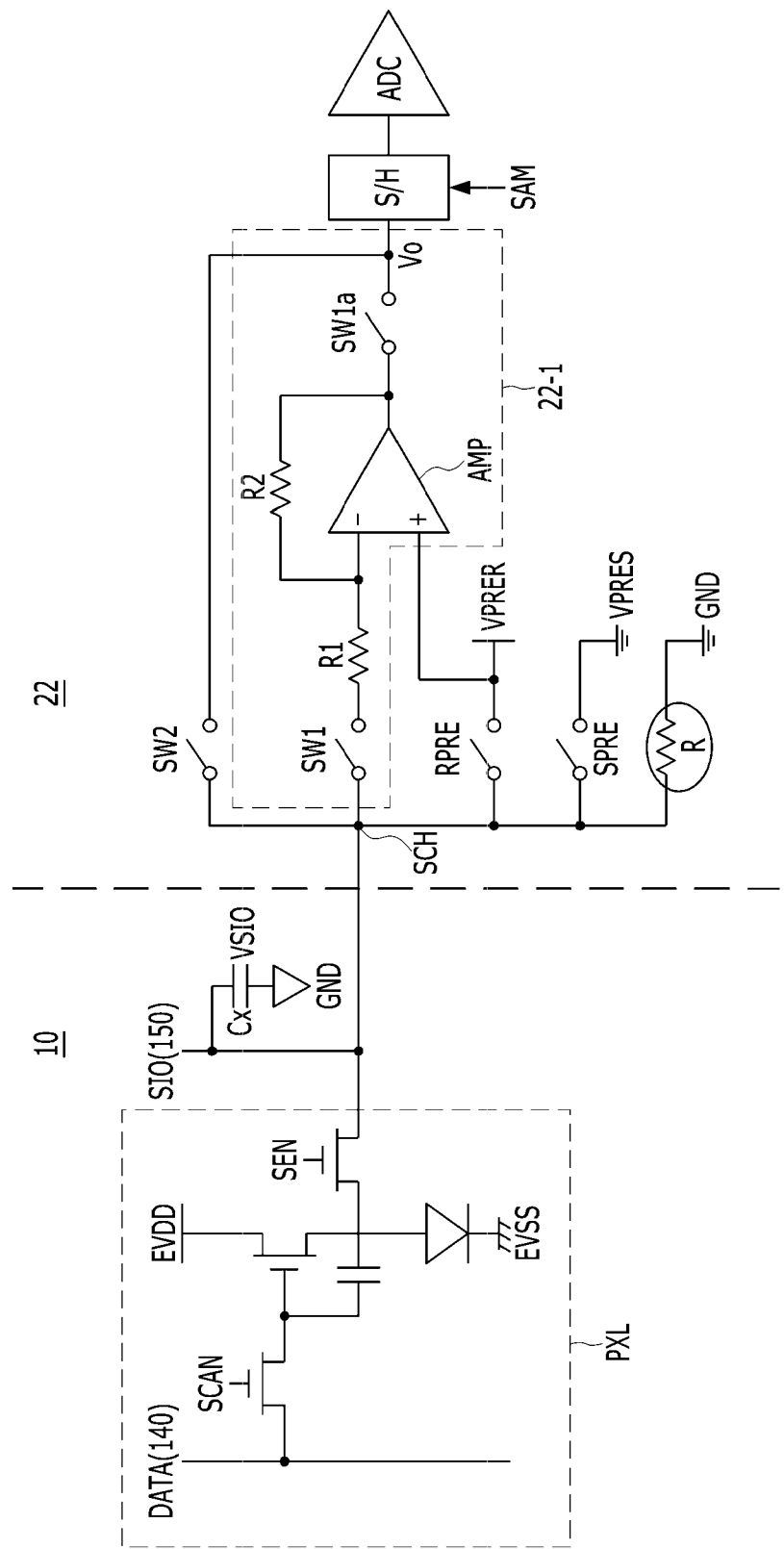
FIG. 15 is a diagram illustrating a circuit for sensing driving characteristic variation in pixels and voltage variation in sensing lines in a second embodiment of the present disclosure.
Figure 16:
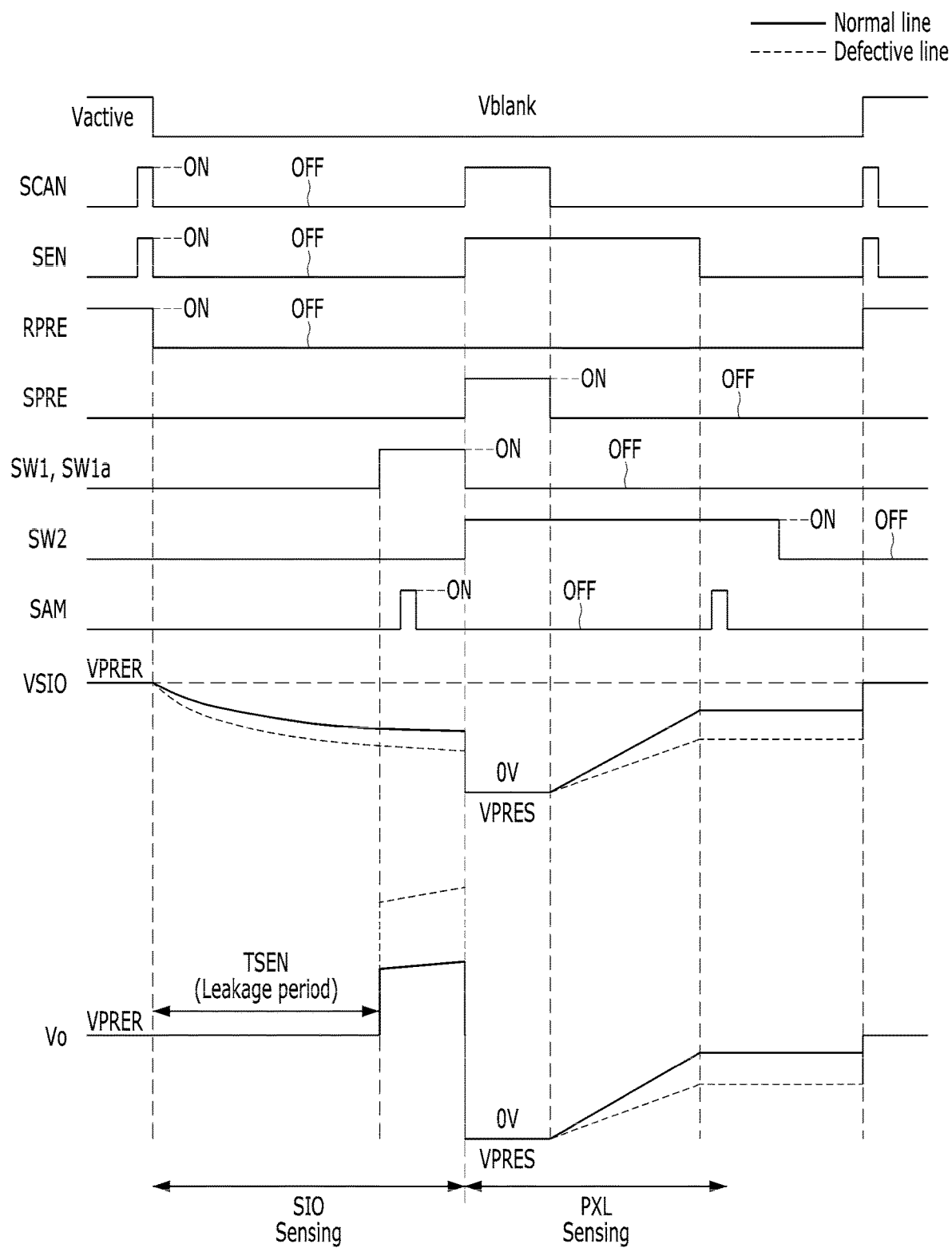
FIG. 16 is a driving waveform diagram with respect to the circuit of FIG. 15.

FIG. 15 is a diagram illustrating a circuit for sensing driving characteristic variation in pixels and voltage variation in sensing lines in a second embodiment of the present disclosure, and FIG. 16 is a driving waveform diagram with respect to the circuit of FIG. 15.

Referring to FIG. 15, the sensing circuit 22 may include a sensing channel terminal SCH connected to the sensing line 150, a switch RPRE connected between the sensing channel terminal SCH and an input terminal for the first reference voltage VPRER, a switch SPRE connected between the sensing channel terminal SCH and an input terminal for the second reference voltage VPRES, and a sampling unit S/H. In FIG. 15, R equivalently represents leakage resistance of the sensing line 150. Sensing lines 150 may have different values of the leakage resistance R, and the leakage resistance R may be any one of a normal value, a defect value, and an intermediate value between the normal value and the defect value, as shown in FIG. 6. In FIG. 15, Cx represents a parasitic capacitor present in the sensing line 150.

The sampling unit S/H may realize SIO sensing operation by sensing the voltage VSIO of the sensing line 150 which has changed from the first reference voltage VPRER independent of driving characteristics of the pixel PXL in a vertical blank period Vblank in which the switch RPRE is turned off.

Referring to FIG. 15, the sensing circuit 22 may further include a first non-inverting amplification circuit 22-1 connected to the sensing channel terminal SCH, the input terminal for the first reference voltage VPRER, and the sampling unit S/H and enabled in an SIO sensing period to speed up detection of variation in the voltage VSIO of the sensing line 150 and to improve sensing discrimination.

The first non-inverting amplification circuit 22-1 includes an OP amplifier AMP having an inverting input terminal (−), a non-inverting input terminal (+) connected to the input terminal for the first reference voltage VPRER, and an output terminal, a first resistor R1 connected to the inverting input terminal (−) of the OP amplifier AMP, a second resistor R2 connected between the inverting input terminal (−) and the output terminal of the OP amplifier AMP, a switch SW1 connected between the sensing channel terminal SCH and the first resistor R1, and a switch SW1a connected between the output terminal of the OP amplifier AMP and the sampling unit S/H.

Referring to FIG. 15, the sensing circuit 22 further includes a switch SW2 connected between the sensing channel terminal SCH and the sampling unit S/H. The switch SW2 may maintain an off state in an SIO sensing period and maintain an on state in a pixel sensing period such that an amplification result of the first non-inverting amplification circuit 22-1 is input to the sampling unit S/H only in the SIO sensing period. In the description, reference may be made to switches being in an "on state" or in an "off state." Generally, a switch in the "on state" is able to conduct electrical current, and a switch in the "off state" does not conduct electrical current, e.g., presents an open circuit.

Referring to FIG. 16, the sensing circuit 22 charges the first reference voltage VPRER in the parasitic capacitor Cx of the sensing line 150 for display operation in a vertical active period Vactive preceding a vertical blank period Vblank.

The SIO sensing period may be allocated within the vertical blank period Vblank.

In the SIO sensing period, the sensing line 150 is electrically disconnected from the pixel PXL, the input terminal for the first reference voltage VPRER, and the input terminal for the second reference voltage VPRES. In such a pseudo-floating state, a discharging path connected to the ground voltage GND through the leakage resistance R may be formed in the sensing line 150. In a normal case, decrement in the voltage VSIO of the sensing line 150 is small (natural discharging) because the leakage resistance R of the sensing line 150 is large. On the other hand, in an abnormal case such as pseudo-short-circuiting, decrement in the voltage VSIO of the sensing line 150 increases (over-discharging) because the leakage resistance R of the sensing line decreases.

The first non-inverting amplification circuit 22-1 amplifies a difference between the voltage VSIO of the sensing line and the first reference voltage VPRER while the switch SW1 and the switch SW1a maintain an on state, e.g., are closed and conduct current, in the SIO sensing period. That is, the first non-inverting amplification circuit 22-1 amplifies variation in the voltage VSIO of the sensing line 150 to generate an output voltage Vo as represented by Formula 1.

$$\frac{V_o - VPRER}{R2} = \frac{VPRER - VSIO}{R1} \quad \text{Formula 1}$$

$$V_o = \left(\frac{VPRER - VSIO}{R1}\right) * R2 + VPRER$$

$$V_o = VPRER * \left(\frac{R2}{R1}\right) - VSIO * \left(\frac{R2}{R1}\right) + VPRER$$

$$V_o = VPRER * \left(\frac{R2}{R1} + 1\right) - VSIO * \left(\frac{R2}{R1}\right)$$

The sampling unit S/H can detect voltage deviation between sensing lines 150 by sampling the voltage VSIO of the sensing line 150 varied due to discharging, that is, the output voltage Vo of the first non-inverting amplification circuit 22-1.

A pixel sensing period may be allocated following the SIO sensing period in the vertical blank period Vblank.

In the pixel sensing period, the sensing line 150 continues to be connected to the second node of the pixel PXL. The pixel sensing period may include a programming period and a sampling period. In the programming period, the switch SPRE is turned on such that the second reference voltage VPRES (0 V) is applied to the second node of the pixel PXL through the sensing line 150. Here, the sensing data voltage is applied to the first node of the pixel PXL through the data line 140. In the sampling period, the pixel PXL becomes a substantially constant current source that generates a pixel current. This pixel current causes the voltage of the second node to increase, and the slope of the increasing voltage depends on driving characteristics of the pixel PXL. In the sampling period, change in the voltage of the second node is reflected in the voltage VSIO of the sensing line 150 because the pixel PXL and the sensing line 150 maintain a connected state. The sampling unit S/H can detect voltage deviation between pixels with respect to the voltage of the second node by being connected to the sensing line 150 through the second switch SW2 and sampling the voltage VSIO of the sensing line 150.

Third Embodiments

Figure 17:
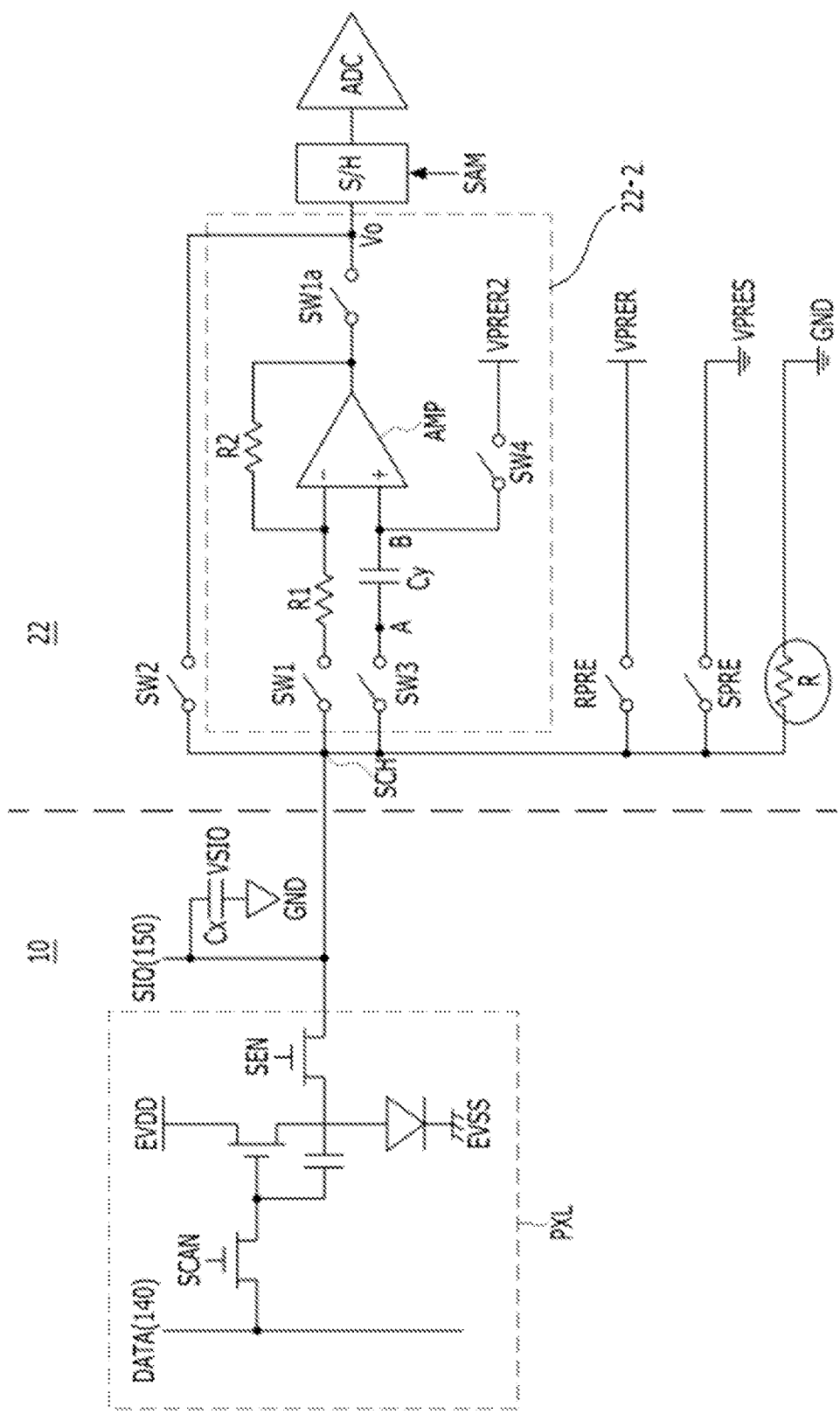
FIG. 17 is a diagram illustrating a circuit for sensing driving characteristic variation in pixels and voltage variation in sensing lines in a third embodiment of the present disclosure.
Figure 18:
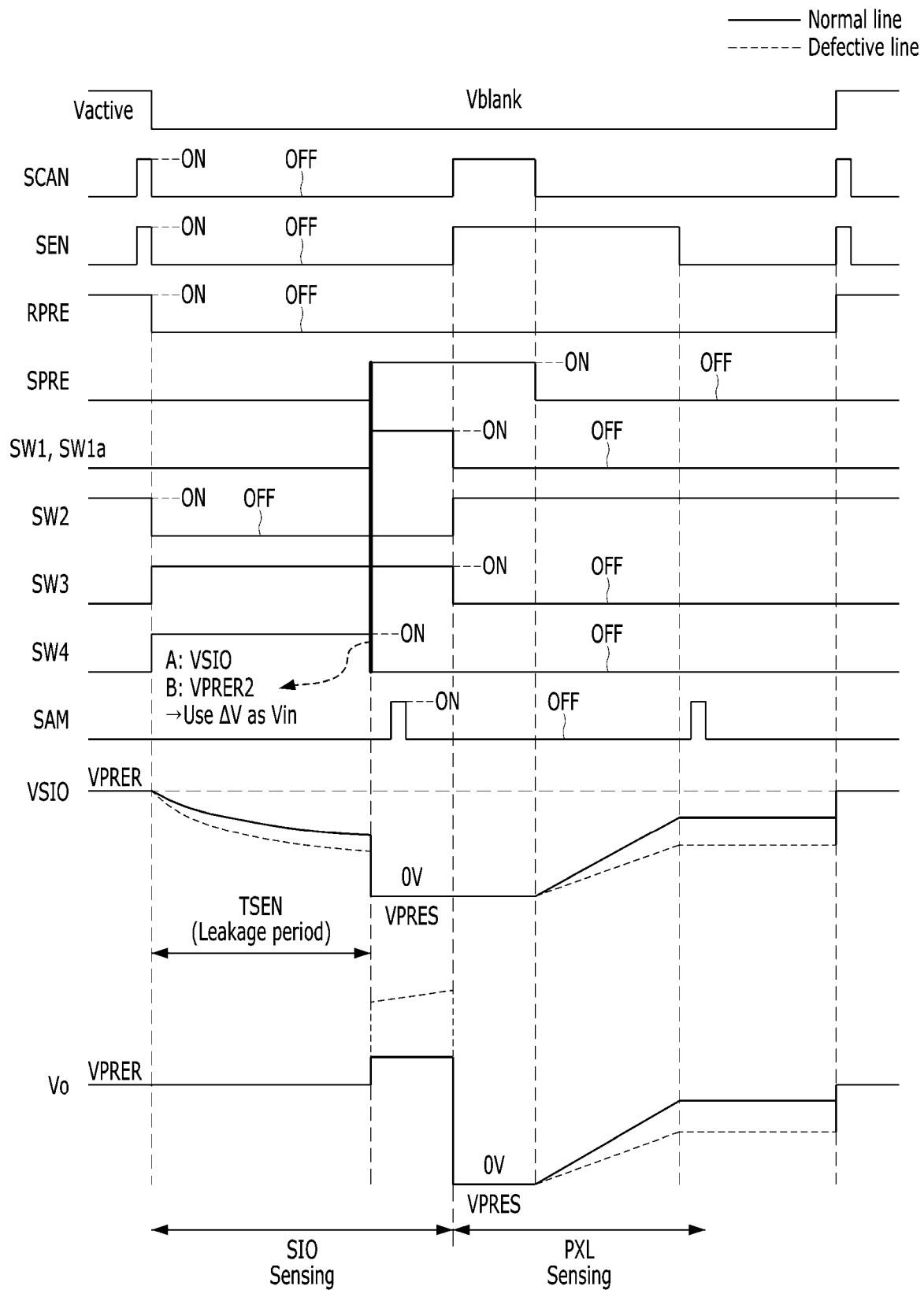
FIG. 18 is a driving waveform diagram with respect to the circuit of FIG. 17.

FIG. 17 is a diagram illustrating a circuit for sensing driving characteristic variation in pixels and voltage variation in sensing lines in a third embodiment of the present disclosure, and FIG. 18 is a driving waveform diagram with respect to the circuit of FIG. 17.

Referring to FIG. 17, the sensing circuit 22 may include a sensing channel terminal SCH connected to the sensing line 150, a switch RPRE connected between the sensing channel terminal SCH and an input terminal for the first reference voltage VPRER, a switch SPRE connected between the sensing channel terminal SCH and an input terminal for the second reference voltage VPRES, and a sampling unit S/H. In FIG. 17, R equivalently represents leakage resistance of the sensing line 150. Sensing lines 150 may have different values of the leakage resistance R, and the leakage resistance R may be any one of a normal value, a defect value, and an intermediate value between the normal value and the defect value, as shown in FIG. 6. In FIG. 17, Cx represents a parasitic capacitor present in the sensing line 150.

The sampling unit S/H may realize SIO sensing operation by sensing the voltage VSIO of the sensing line 150 which has changed from the first reference voltage VPRER independent of driving characteristics of the pixel PXL in a vertical blank period Vblank in which the switch RPRE is turned off.

Referring to FIG. 17, the sensing circuit 22 may further include a second non-inverting amplification circuit 22-2 connected to an input terminal for the third reference voltage VPRER2 higher than the first reference voltage VPRER, the sensing channel terminal SCH, and the sampling unit S/H and enabled in an SIO sensing period to reduce a time beneficial to detect variation in the voltage VSIO of the sensing line 150 and to improve sensing discrimination. The second non-inverting amplification circuit 22-2 can further improve sensing discrimination by using voltage variation ΔV (e.g., VPRER2-VSIO) due to sensing line leakage as a (+) input value of an OP amplifier AMP and using the ground voltage GND as a (−) input value of the OP amplifier AMP. Since the third reference voltage VPRER2 is set to be higher than the first reference voltage VPRER, sensing discrimination can be further improved even in a situation in which a sensing time is short.

The second non-inverting amplification circuit 22-2 includes the OP amplifier AMP having an inverting input terminal (−), a non-inverting input terminal (+) connected to the input terminal for the third reference voltage VPRER2, and an output terminal, a first resistor R1 connected to the inverting input terminal (−) of the OP amplifier AMP, a second resistor R2 connected between the inverting input terminal (−) and the output terminal of the OP amplifier AMP, a switch SW1 connected between the sensing channel terminal SCH and the first resistor R1, a switch SW1a connected between the output terminal of the OP amplifier AMP and the sampling unit S/H, a capacitor Cy having one electrode B connected to the non-inverting input terminal (+) of the OP amplifier AMP, a switch SW3 connected between the sensing channel terminal SCH and the other electrode A of the capacitor Cy, and a switch SW4 connected between the non-inverting input terminal (+) of the OP amplifier AMP and the input terminal for the third reference voltage VPRER2.

Referring to FIG. 17, the sensing circuit 22 further includes a switch SW2 connected between the sensing channel terminal SCH and the sampling unit S/H. The switch SW2 may maintain an off state in an SIO sensing period and maintain an on state in a pixel sensing period such that an amplification result of the second non-inverting amplification circuit 22-2 is input to the sampling unit S/H only in the SIO sensing period.

Referring to FIG. 18, the sensing circuit 22 charges the first reference voltage VPRER in the parasitic capacitor Cx of the sensing line 150 for display operation in a vertical active period Vactive preceding a vertical blank period Vblank.

The SIO sensing period may be allocated within the vertical blank period Vblank.

In the SIO sensing period, the sensing line 150 is electrically disconnected from the pixel PXL, the input terminal for the first reference voltage VPRER, and the input terminal for the second reference voltage VPRES. In such a pseudo-floating state, a discharging path connected to the ground voltage GND through the leakage resistance R may be formed in the sensing line 150. In a normal case, decrement in the voltage VSIO of the sensing line 150 is small (natural discharging) because the leakage resistance R of the sensing line 150 is large. On the other hand, in an abnormal case such as pseudo-short-circuiting, decrement in the voltage VSIO of the sensing line 150 increases (over-discharging) because the leakage resistance R of the sensing line decreases.

When the switch SW3 is turned on while the switch SW4 maintains an on state, a difference between the voltage VSIO of the sensing line 150 and the third reference voltage VPRER2 is stored in the capacitor Cy, and "VPRER2-VSIO" is applied to the non-inverting input terminal (+) of the OP amplifier AMP according to capacitor coupling at timing when the switch SPRE is turned on.

The second non-inverting amplification circuit 22-2 amplifies a difference between the voltage VSIO of the sensing line and the third reference voltage VPRER2 while the switch SW1, the switch SW1a, and the switch SW3 maintain an on state in the SIO sensing period. That is, the second non-inverting amplification circuit 22-2 amplifies variation in the voltage VSIO of the sensing line 150 to generate an output voltage Vo as represented by Formula 2.

$$\frac{V_o - VPRER2}{R2} = \frac{VPRER2 - VSIO}{R1} \quad \text{Formula 2}$$

$$V_o = \left(\frac{VPRER2 - VSIO}{R1}\right) * R2 + VPRER2 - VSIO$$

$$V_o = (VPRER2 - VSIO) * \left(\frac{R2}{R1} + 1\right)$$

The sampling unit S/H can detect voltage deviation between sensing lines 150 by sampling the voltage VSIO of the sensing line 150 varied due to discharging, that is, the output voltage Vo of the second non-inverting amplification circuit 22-2.

A pixel sensing period may be allocated following the SIO sensing period in the vertical blank period Vblank.

In the pixel sensing period, the sensing line 150 continues to be connected to the second node of the pixel PXL. The pixel sensing period may include a programming period and a sampling period. In the programming period, the switch SPRE is turned on such that the second reference voltage VPRES (0 V) is applied to the second node of the pixel PXL through the sensing line 150. Here, the sensing data voltage is applied to the first node of the pixel PXL through the data line 140. In the sampling period, the pixel PXL becomes a constant current source that generates a pixel current. This pixel current causes the voltage of the second node to increase, and the slope of the increasing voltage depends on driving characteristics of the pixel PXL. In the sampling period, change in the voltage of the second node is reflected in the voltage VSIO of the sensing line 150 because the pixel PXL and the sensing line 150 maintain a connected state. The sampling unit S/H can detect voltage deviation between pixels with respect to the voltage of the second node by being connected to the sensing line 150 through the switch SW2 and sampling the voltage VSIO of the sensing line 150.

Fourth Embodiments

Figure 19:
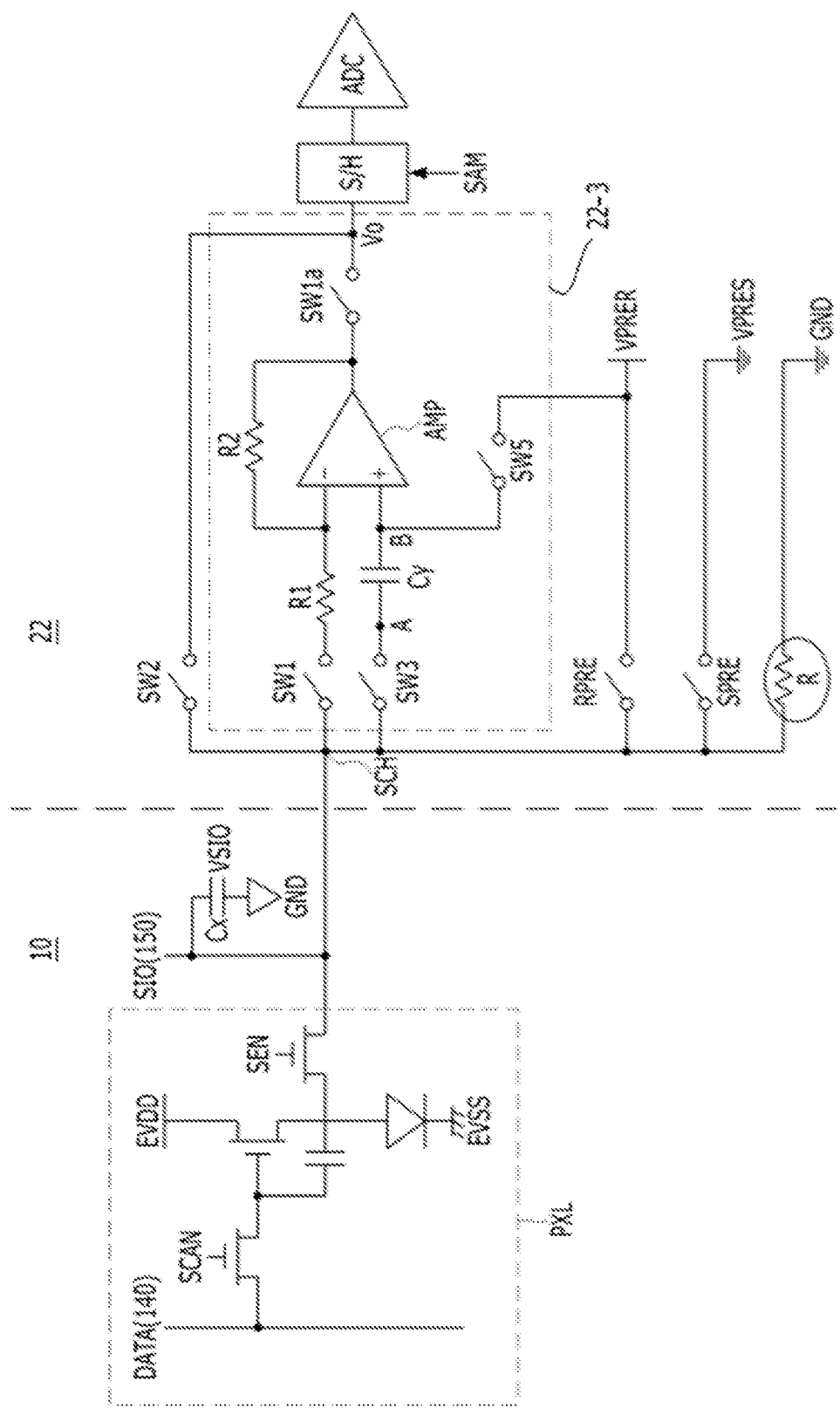
FIG. 19 is a diagram illustrating a circuit for sensing driving characteristic variation in pixels and voltage variation in sensing lines in a fourth embodiment of the present disclosure.
Figure 20:
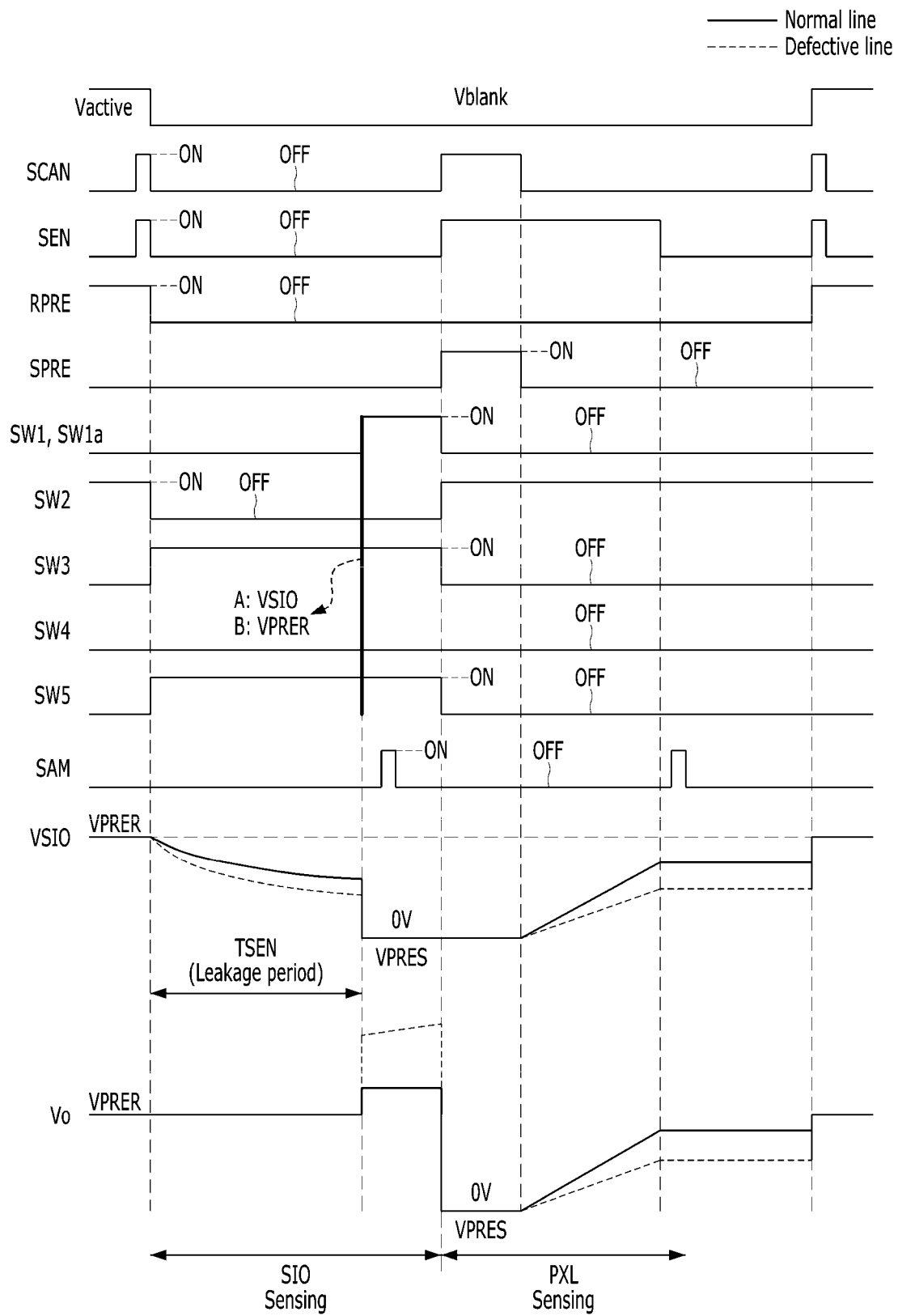
FIG. 20 is a driving waveform diagram with respect to the circuit of FIG. 19.

FIG. 19 is a diagram illustrating a circuit for sensing driving characteristic variation in pixels and voltage variation in sensing lines in a fourth embodiment of the present disclosure, and FIG. 20 is a driving waveform diagram with respect to the circuit of FIG. 19.

Referring to FIG. 19, the sensing circuit 22 may include a sensing channel terminal SCH connected to the sensing line 150, a switch RPRE connected between the sensing channel terminal SCH and an input terminal for the first reference voltage VPRER, a switch SPRE connected between the sensing channel terminal SCH and an input terminal for the second reference voltage VPRES, and a sampling unit S/H. In FIG. 19, R equivalently represents leakage resistance of the sensing line 150. Sensing lines 150 may have different values of the leakage resistance R, and the leakage resistance R may be any one of a normal value, a defect value, and an intermediate value between the normal value and the defect value, as shown in FIG. 6. In FIG. 19, Cx represents a parasitic capacitor present in the sensing line 150.

The sampling unit S/H may realize SIO sensing operation by sensing the voltage VSIO of the sensing line 150 which has changed from the first reference voltage VPRER independent of driving characteristics of the pixel PXL in a vertical blank period Vblank in which the switch RPRE is turned off.

Referring to FIG. 19, the sensing circuit 22 may further include a third non-inverting amplification circuit 22-3 connected to the input terminal for the first reference voltage VPRER, the sensing channel terminal SCH, and the sampling unit S/H and enabled in an SIO sensing period to reduce a time beneficial to detect variation in the voltage VSIO of the sensing line 150 and to improve sensing discrimination. The third non-inverting amplification circuit 22-3 can further improve sensing discrimination by using the first reference voltage VPRER as a (+) input value of an OP amplifier AMP and using the voltage VSIO of the sensing line 150 as a (−) input value of the OP amplifier AMP.

The third non-inverting amplification circuit 22-3 includes the OP amplifier AMP having an inverting input terminal (−), a non-inverting input terminal (+) connected to the input terminal for the first reference voltage VPRER, and an output terminal, a first resistor R1 connected to the inverting input terminal (−) of the OP amplifier AMP, a second resistor R2 connected between the inverting input terminal (−) and the output terminal of the OP amplifier AMP, a switch SW1 connected between the sensing channel terminal SCH and the first resistor R1, a switch SW1a connected between the output terminal of the OP amplifier AMP and the sampling unit S/H, a capacitor Cy having one electrode B connected to the non-inverting input terminal (+) of the OP amplifier AMP, a switch SW3 connected between the sensing channel terminal SCH and the other electrode A of the capacitor Cy, and a switch SW5 connected between the non-inverting input terminal (+) of the OP amplifier AMP and the input terminal for the first reference voltage VPRER.

Referring to FIG. 19, the sensing circuit 22 further includes a switch SW2 connected between the sensing channel terminal SCH and the sampling unit S/H. The switch SW2 may maintain an off state in an SIO sensing period and maintain an on state in a pixel sensing period such that an amplification result of the third non-inverting amplification circuit 22-3 is input to the sampling unit S/H only in the SIO sensing period.

Referring to FIG. 20, the sensing circuit 22 charges the first reference voltage VPRER in the parasitic capacitor Cx of the sensing line 150 for display operation in a vertical active period Vactive preceding a vertical blank period Vblank.

The SIO sensing period may be allocated within the vertical blank period Vblank.

In the SIO sensing period, the sensing line 150 is electrically disconnected from the pixel PXL, the input terminal for the first reference voltage VPRER, and the input terminal for the second reference voltage VPRES. In such a pseudo-floating state, a discharging path connected to the ground voltage GND through the leakage resistance R may be formed in the sensing line 150. In a normal case, decrement in the voltage VSIO of the sensing line 150 is small (natural discharging) because the leakage resistance R of the sensing line 150 is large. On the other hand, in an abnormal case such as pseudo-short-circuiting, decrement in the voltage VSIO of the sensing line 150 increases (over-discharging) because the leakage resistance R of the sensing line decreases.

The third non-inverting amplification circuit 22-3 amplifies a difference between the voltage VSIO of the sensing line and the first reference voltage VPRER while the switch SW1, the switch SW1a, the switch SW3, and the switch SW5 maintain an on state in the SIO sensing period. That is, the third non-inverting amplification circuit 22-3 amplifies variation in the voltage VSIO of the sensing line 150 to generate an output voltage Vo as represented by Formula 1.

The sampling unit S/H can detect voltage deviation between sensing lines 150 by sampling the voltage VSIO of the sensing line 150 varied due to discharging, that is, the output voltage Vo of the third non-inverting amplification circuit 22-3.

A pixel sensing period may be allocated following the SIO sensing period in the vertical blank period Vblank.

In the pixel sensing period, the sensing line 150 continues to be connected to the second node of the pixel PXL. The pixel sensing period may include a programming period and a sampling period. In the programming period, the switch SPRE is turned on such that the second reference voltage VPRES (0 V) is applied to the second node of the pixel PXL through the sensing line 150. Here, the sensing data voltage is applied to the first node of the pixel PXL through the data line 140. In the sampling period, the pixel PXL becomes a constant current source that generates a pixel current. This pixel current causes the voltage of the second node to increase, and the slope of the increasing voltage depends on driving characteristics of the pixel PXL. In the sampling period, change in the voltage of the second node is reflected in the voltage VSIO of the sensing line 150 because the pixel PXL and the sensing line 150 maintain a connected state. The sampling unit S/H can detect voltage deviation between pixels with respect to the voltage of the second node by being connected to the sensing line 150 through the switch SW2 and sampling the voltage VSIO of the sensing line 150.

It will be apparent to those skilled in the art that various modifications and variations can be made in the present disclosure without departing from the spirit or scope of the disclosure. Thus, the scope of the present disclosure should be determined by the appended claims and their legal equivalents, not by the above description.

The electroluminescent display device according to embodiments of the present disclosure can improve image quality by compensating for charging voltage sustainability differences between sensing lines.

The electroluminescent display device according to embodiments of the present disclosure can reduce a time beneficial to detect voltage variation in a sensing line and improve sensing discrimination by further including a non-inverting amplification circuit in a sensing circuit.

Effects which may be obtained by the present disclosure are not limited to the above-described effects, and various other effects may be evidently understood by those skilled in the art to which the present disclosure pertains from the following description.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a pixel configured to display an image based on a difference between a display data voltage and a first reference voltage;
a driving voltage generation circuit configured to supply the display data voltage to the pixel through a data line; and
a sensing circuit configured to supply the first reference voltage to the pixel through a sensing line, the sensing circuit including:
a sensing channel terminal coupled to the sensing line;
a switch coupled between the sensing channel terminal and an input terminal for the first reference voltage; and
a sampling circuit configured to sense a voltage of the sensing line which has changed from the first reference voltage independent of driving characteristics of the pixel in a vertical blank period in which the switch is turned off.

2. The electroluminescent display device of claim 1, wherein the vertical blank period includes a first sensing period and a pixel sensing period in sequence, and
wherein the sampling circuit senses the voltage of the sensing line independent of the driving characteristics of the pixel in the first sensing period and subsequently senses a node voltage of the pixel in the pixel sensing period, the node voltage representing the driving characteristics of the pixel.

3. The electroluminescent display device of claim 2, further comprising a non-inverting amplification circuit coupled to the sensing channel terminal, the input terminal for the first reference voltage and the sampling circuit, and enabled in the first sensing period.

4. The electroluminescent display device of claim 3, wherein the non-inverting amplification circuit includes:
an operational amplifier having an inverting input terminal, a non-inverting input terminal coupled to the input terminal for the first reference voltage, and an output terminal;
a first resistor coupled to the inverting input terminal of the operational amplifier;

a second resistor coupled between the inverting input terminal and the output terminal of the operational amplifier;
a second switch coupled between the sensing channel terminal and the first resistor; and
a third switch coupled between the output terminal of the operational amplifier and the sampling circuit.

5. The electroluminescent display device of claim 4, wherein the non-inverting amplification circuit amplifies a difference between the voltage of the sensing line and the first reference voltage while the second switch and the third switch are in an on state in the first sensing period.

6. The electroluminescent display device of claim 3, further comprising a second switch connected between the sensing channel terminal and the sampling circuit,
wherein the second switch maintains an off state in the first sensing period and maintains an on state in the pixel sensing period.

7. The electroluminescent display device of claim 2, further comprising a non-inverting amplification circuit coupled to an input terminal for a second reference voltage higher than the first reference voltage, the sensing channel terminal, and the sampling circuit and enabled in the first sensing period.

8. The electroluminescent display device of claim 7, wherein the non-inverting amplification circuit includes:
an operational amplifier having an inverting input terminal, a non-inverting input terminal, and an output terminal;
a first resistor coupled to the inverting input terminal of the operational amplifier;
a second resistor coupled between the inverting input terminal and the output terminal of the operational amplifier;
a second switch coupled between the sensing channel terminal and the first resistor;
a third switch coupled between the output terminal of the operational amplifier and the sampling circuit;
a capacitor having one electrode coupled to the non-inverting input terminal of the operational amplifier;
a fourth switch coupled between the sensing channel terminal and the other electrode of the capacitor; and
a fifth switch coupled between the non-inverting input terminal of the operational amplifier and the input terminal for the second reference voltage.

9. The electroluminescent display device of claim 8, wherein the non-inverting amplification circuit amplifies a difference between the voltage of the sensing line and the second reference voltage while the second switch, the third switch, and the fourth switch maintain an on state in the first sensing period.

10. The electroluminescent display device of claim 7, further comprising a second switch connected between the sensing channel terminal and the sampling circuit,
wherein the second switch maintains an off state in the first sensing period and maintains an on state in the pixel sensing period.

11. The electroluminescent display device of claim 2, further comprising a non-inverting amplification circuit coupled to the input terminal for the first reference voltage, the sensing channel terminal, and the sampling circuit and enabled in the first sensing period.

12. The electroluminescent display device of claim 11, wherein the non-inverting amplification circuit includes:
an operational amplifier having an inverting input terminal, a non-inverting input terminal, and an output terminal;
a first resistor coupled to the inverting input terminal of the operational amplifier;
a second resistor coupled between the inverting input terminal and the output terminal of the operational amplifier;
a second switch coupled between the sensing channel terminal and the first resistor;
a third switch coupled between the output terminal of the operational amplifier and the sampling circuit;
a capacitor having one electrode coupled to the non-inverting input terminal of the operational amplifier;
a fourth switch coupled between the sensing channel terminal and the other electrode of the capacitor; and
a fifth switch coupled between the non-inverting input terminal of the operational amplifier and the input terminal for the first reference voltage.

13. The electroluminescent display device of claim 12, wherein the non-inverting amplification circuit amplifies a difference between the voltage of the sensing line and the first reference voltage while the second switch, the third switch, the fourth switch, and the fifth switch are in an on state in the first sensing period.

14. The electroluminescent display device of claim 11, further comprising a second switch connected between the sensing channel terminal and the sampling circuit,
wherein the second switch maintains an off state in the first sensing period and maintains an on state in the pixel sensing period.

15. The electroluminescent display device of claim 2, wherein a duration of a vertical active period preceding the vertical blank period is fixed independent of a frame frequency, and a duration of the vertical blank period changes according to the frame frequency.

16. The electroluminescent display device of claim 15, wherein a first vertical blank period of a first frame frequency includes the first sensing period and the pixel sensing period, and a second vertical blank period of a second frame frequency includes the pixel sensing period and is free of the first sensing period, and wherein the second frame frequency is higher than the first frame frequency.

17. The electroluminescent display device of claim 2, wherein electrical connection between the sensing line and the pixel is blocked in the first sensing period, and the sensing line is electrically coupled to the pixel in the pixel sensing period.

18. The electroluminescent display device of claim 1, wherein the sensing line is charged with the first reference voltage in a vertical active period preceding the vertical blank period.

19. A system comprising:
a display panel;
a driver integrated circuit including:
a driving voltage generation circuit configured to supply display data voltage to the display panel through a plurality of data lines; and
a sensing circuit coupled to the display panel, the sensing circuit configured to generate digital sensing result data, the sensing circuit including:
a sensing channel terminal coupled to a sensing line of the display panel;
a switch configured to selectively couple/decouple a reference voltage used in a display operation to/from the sensing channel terminal; and
a sampling circuit configured to sense discharge characteristics of the sensing lines in which voltages decrease from the reference voltage during a sensing operation; and a compensation integrated circuit configured to generate corrected video data based on the digital sensing result data.

20. The system of claim 19, wherein the sensing line and a pixel of the display panel are continuously disconnected from each other during the sensing operation.

* * * * *